United States Patent
Xu et al.

(10) Patent No.: US 8,633,528 B2
(45) Date of Patent: Jan. 21, 2014

(54) METHODS AND APPARATUS FOR INCREASING MEMORY DENSITY USING DIODE LAYER SHARING

(71) Applicant: SanDisk 3D LLC, Milpitas, CA (US)

(72) Inventors: Huiwen Xu, Sunnyvale, CA (US); Er-Xuan Ping, Fremont, CA (US); Roy E. Scheuerlein, Cupertino, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 13/674,513

(22) Filed: Nov. 12, 2012

(65) Prior Publication Data

US 2013/0313503 A1    Nov. 28, 2013

Related U.S. Application Data

(63) Continuation of application No. 12/541,078, filed on Aug. 13, 2009, now Pat. No. 8,309,415.

(60) Provisional application No. 61/088,665, filed on Aug. 13, 2008.

(51) Int. Cl.
   *H01L 29/76* (2006.01)
(52) U.S. Cl.
   USPC .......................... 257/296; 257/300; 257/306
(58) Field of Classification Search
   USPC .................. 257/296, 298, 300, 303, 306
   See application file for complete search history.

(56) References Cited

U.S. PATENT DOCUMENTS

| | | | |
|---|---|---|---|
| 7,176,064 B2 | 2/2007 | Herner | |
| 7,955,981 B2 * | 6/2011 | Chen et al. | 438/689 |
| 7,977,667 B2 * | 7/2011 | Schricker et al. | 257/30 |
| 8,237,146 B2 * | 8/2012 | Kreupl et al. | 257/4 |
| 2006/0183282 A1 | 8/2006 | Raghuram et al. | |
| 2006/0250836 A1 | 11/2006 | Herner et al. | |
| 2007/0108429 A1 | 5/2007 | Lung et al. | |
| 2008/0017890 A1 | 1/2008 | Yuan et al. | |
| 2008/0070162 A1 | 3/2008 | Ufert | |
| 2008/0237599 A1 | 10/2008 | Herner et al. | |
| 2010/0038620 A1 | 2/2010 | Xu | |
| 2010/0038623 A1 | 2/2010 | Xu | |

FOREIGN PATENT DOCUMENTS

| | | |
|---|---|---|
| EP | 0 732 624 A2 | 9/1996 |
| WO | WO 03/085675 A2 | 10/2003 |

OTHER PUBLICATIONS

Schricker, et al., U.S. Appl. No. 12/421,405, filed Apr. 9, 2009.
International Search Report and Written Opinion of International Application No. PCT/US2009/053737 dated Nov. 23, 2009.
International Search Report and Written Opinion of International Application No. PCT/US2009/053745 dated Nov. 23, 2009.
Restriction Requirement in related U.S. Appl. No. 12/541,075 dated Dec. 28, 2010.
Jan. 17, 2011 Reply to Dec. 28, 2010 Restriction Requirement in related U.S. Appl. No. 12/541,075.
Office Action in related U.S. Appl. No. 12/541,075 dated Mar. 18, 2011.

(Continued)

*Primary Examiner* — Kevin M Picardat
(74) *Attorney, Agent, or Firm* — Dugan & Dugan, PC

(57) ABSTRACT

A memory is described that includes a shared diode layer and a memory element coupled to the diode layer. The memory element has a pie slice-shape, and includes a sidewall having a carbon film thereon. Numerous other aspects are also disclosed.

20 Claims, 18 Drawing Sheets

(56) References Cited

OTHER PUBLICATIONS

Jun. 20, 2011 Reply to Mar. 18, 2011 Office Action in related U.S. Appl. No. 12/541,075.
Notice of Allowance in related U.S. Appl. No. 12/541,075 dated Sep. 20, 2011.
Restriction Requirement in related U.S. Appl. No. 12/541,078 dated Jan. 9, 2012.
Jan. 30, 2012 Response to Jan. 9, 2012 Restriction Requirement in related U.S. Appl. No. 12/541,078.
Office Action in related U.S. Appl. No. 12/541,078 mailed Mar. 23, 2012.
Jun. 20, 2012 Response and Terminal Disclaimer to Mar. 23, 2012 Office Action in related U.S. Appl. No. 12/541,078.
Notice of Allowance in related U.S. Appl. No. 12/541,078 mailed Jul. 11, 2012.

* cited by examiner

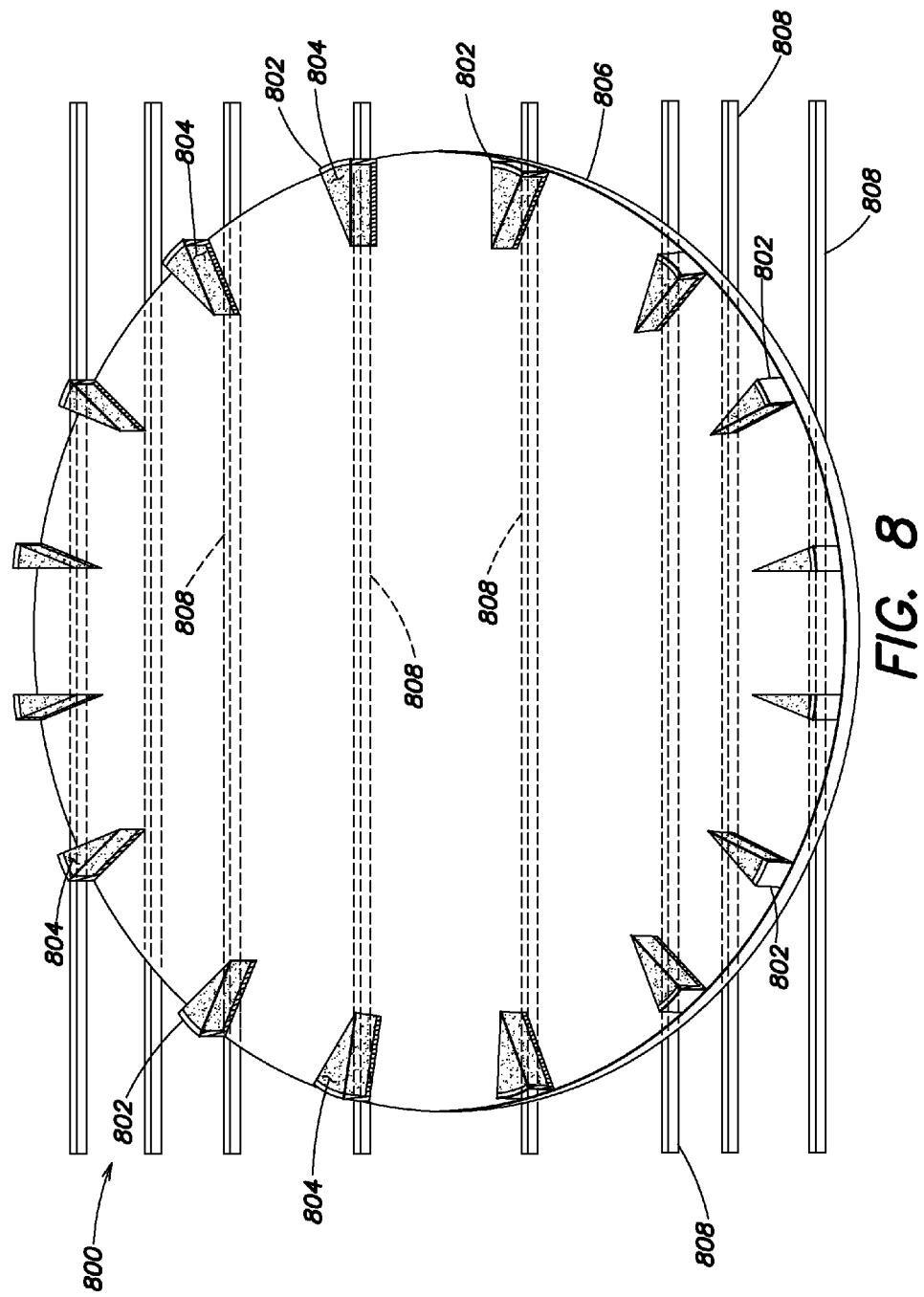

METHODS AND APPARATUS FOR INCREASING MEMORY DENSITY USING DIODE LAYER SHARING

REFERENCE TO RELATED APPLICATIONS

This application is a continuation of U.S. patent application Ser. No. 12/541,078, filed Aug. 13, 2009, now U.S. Pat. No. 8,309,415, which is incorporated by reference herein in its entirety for all purposes.

This application claims the benefit of U.S. Provisional Patent Application Ser. No. 61/088,665, filed Aug. 13, 2008, which is incorporated by reference herein in its entirety for all purposes.

This application is related to U.S. Provisional Patent Application Ser. No. 61/088,668, filed Aug. 13, 2008, which is incorporated by reference herein in its entirety for all purposes.

This application is also related to U.S. patent application Ser. No. 12/541,075, filed Aug. 13, 2009, now U.S. Pat. No. 8,093,123, which is incorporated by reference herein in its entirety for all purposes.

BACKGROUND

The present invention relates to non-volatile memories and more particularly to integration methods for carbon films in two- and three-dimensional memories, and memories formed from such methods.

Non-volatile memories are known. As the demand for memory capabilities increases, there is a continual need to increase the number of memory cells in a memory device. However, fabricating memory cells for use in such memory devices continues to be technically challenging. Accordingly, improved methods of forming memory cells for use in memory devices are desirable.

SUMMARY

In some embodiments, the present invention provides a method of forming a memory cell. The method includes forming a first pillar above a substrate, wherein the pillar includes a steering element and a first memory element, performing a first etch through the first memory element to form two second memory elements, wherein each second memory element is coupled to the steering element, and performing a second etch through the two second memory elements to form four third memory elements, wherein each third memory element is coupled to the steering element.

In some embodiments, the present invention provides a memory cell formed by forming a first pillar above a substrate, the pillar including a steering element and a first memory element, performing a first etch through the first memory element to form two second memory elements, wherein each second memory element is coupled to the steering element, and performing a second etch through the two second memory elements to form four third memory elements, wherein each third memory element is coupled to the steering element.

In some embodiments, the present invention provides a method of forming a memory cell. The method includes forming a pillar above a substrate, the pillar including a steering element and a memory element, and performing multiple etches through the memory element to divide the memory element into multiple second memory elements each being coupled to the steering element.

In some embodiments, the present invention provides a memory cell formed by forming a pillar above a substrate, the pillar including a steering element and a memory element, and performing multiple etches through the memory element to divide the memory element into multiple second memory elements each being coupled to the steering element.

In some embodiments, the present invention provides a method of forming a memory cell. The method includes forming a first conductor and a second conductor, forming a diode in series with the first and second conductors, forming a reversible resistance-switching element above the first and second conductors including forming a feature having a sidewall and depositing a carbon film on the sidewall of the feature, etching the reversible resistance-switching element along a vertical longitudinal plane to form two reversible resistance-switching elements, one reversible resistance-switching element disposed above each conductor, and forming a third conductor above the reversible resistance-switching elements and the diode.

In some embodiments, the present invention provides a memory cell which includes a shared diode layer and a memory element coupled to the diode layer. The memory element has a pie slice-shape and includes a sidewall having a carbon film thereon.

In some embodiments, the present invention provides a memory cell that includes a shared diode layer shaped into a circular disk, and a plurality of radially disposed memory elements each coupled to the shared diode layer along a circumference of the shared diode layer. The memory elements each have a pie slice-shaped and include a sidewall having a carbon film thereon.

BRIEF DESCRIPTION OF THE DRAWINGS

Features of the present invention can be more clearly understood from the following detailed description considered in conjunction with the following drawings, in which the same reference numerals denote the same elements throughout, and in which:

FIG. 8 is a perspective view of exemplary memory cells in accordance with this invention.

DETAILED DESCRIPTION

Figure 1A:
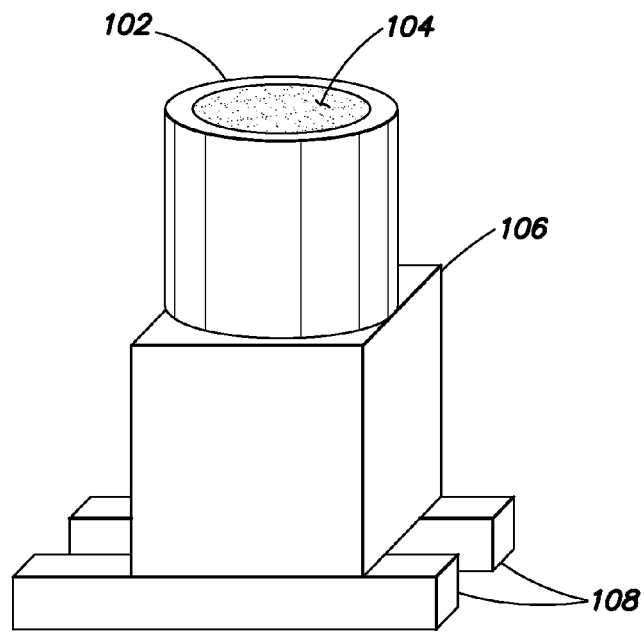
FIG. 1A is an exemplary memory cell.

Non-volatile memories formed from reversible resistance-switching elements are known. For example, U.S. patent application Ser. No. 11/125,939, filed May 9, 2005 and titled "REWRITEABLE MEMORY CELL COMPRISING A DIODE AND A RESISTANCE-SWITCHING MATERIAL"

(hereinafter "the '939 Application"), which is hereby incorporated by reference herein in its entirety for all purposes, describes a rewriteable non-volatile memory cell that includes a diode coupled in series with a reversible resistivity-switching material such as a metal oxide or metal nitride.

Carbon films (e.g., films made from graphitic carbon, non-graphitic carbon, graphene, graphite, amorphous carbon, etc.) may exhibit reversible resistivity-switching properties, making these films candidates for integration within a three-dimensional memory array. However, film orientation and thickness may affect the switching characteristics of a carbon film. For example, when conduction occurs along the length of the carbon pi bonds of a carbon film (e.g., parallel to the plane of the film), switching may be observed.

As schematically represented in FIGS. 1A-1D, the present invention provides a memory cell structure 100 and a manufacturing process for a carbon-based memory element. The methods of the present invention may be used with carbon material 102 that may be conformably deposited on the sidewalls of a memory cell pillar-shaped structure formed with a dielectric 104 core.

The carbon material 102 may function as a reversible resistance-switching element, for example. The carbon material 102 is connected in series with a diode 106 (or other steering element) between conductors 108 and 110. Note that elements of the memory cell structures throughout the drawings are not drawn to scale and, for example, conductors 108 and 110 may be much wider than shown. Diode 106 may be a vertical p-n or p-i-n diode. In some embodiments, diode 106 may be formed from a polycrystalline semiconductor material such as polysilicon, a polycrystalline silicon-germanium alloy, polygermanium or any other suitable material.

According to the present invention, the memory cell pillar structure whose sidewalls upon which the carbon-material 102 is conformably deposited, is etched (e.g., using a highly anisotropic etch such as spacer etch) along a vertically oriented, longitudinal plane which effectively bisects the pillar lengthwise into two independent memory cells in the same space previously occupied by a single memory cell. This process thus increases the memory cell density by two times without any scaling of the pillar structure.

Figure 1B:
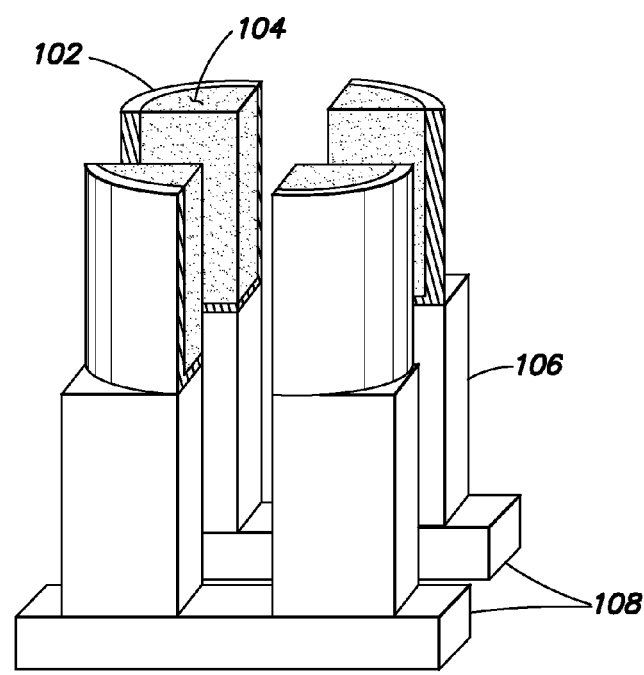
FIGS. 1B-1C are perspective views of exemplary memory cells in accordance with this invention.
Figure 1C:
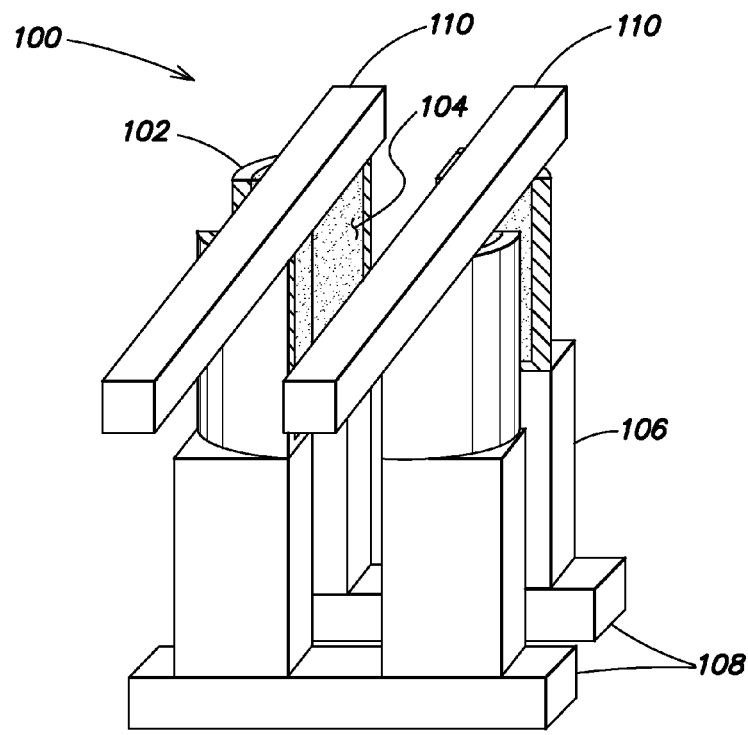
Figure 1D:
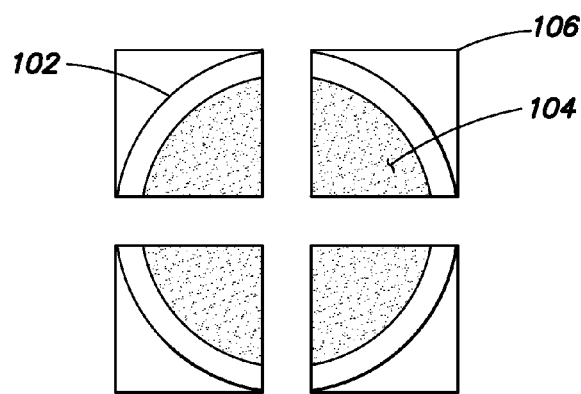
FIG. 1D is a top view of the memory cells of FIG. 1B.

As shown in FIG. 1B, by repeating the etching along a second vertically oriented, longitudinal plane that is approximately perpendicular to the plane of the first etch, the pillar may be divided into a total of four independent memory cells in the same space previously occupied by a single memory cell. Thus, these two processes together (as represented by FIG. 1A before and FIG. 1B after the etching) may be employed to increase the memory cell density by four times. Note that FIG. 1C is the same as FIG. 1B except the conductors 110 are included in FIG. 1C. FIG. 1D depicts a top view of the double etched memory cells 100 with the conductors omitted for clarity.

In some embodiments, the height of the memory cell 100 may be in the range of approximately 1000 A to approximately 5000 A, and preferably in the range of approximately 1200 A to approximately 2500 A. Other practicable heights may be used.

In some embodiments, the height of the diode 106 portion of the memory cell 100 may be in the range of approximately 500 A to approximately 4000 A, and preferably in the range of approximately 800 A to approximately 2500 A. Other practicable diode 106 heights may be used.

In some embodiments, the combined height of the carbon material 102 and dielectric 104 portion of the memory cell 100 may be in the range of approximately 200 A to approximately 2000 A, and preferably in the range of approximately 400 A to approximately 1000 A. Other practicable carbon material 102 and dielectric 104 heights may be used.

To access the "two times" more densely arranged memory cells (i.e., a single etched cell), either the word or bit lines (e.g., metal lines 108, 110 that connect to opposite ends of the memory cells 100 for reading and writing the cells) may be double patterned (to increase the number of lines in a given area to match the more densely arranged memory cells).

To access the "four times" more densely arranged memory cells 100 (i.e., double etched cells), both the word and bit lines may be double patterned. Thus, existing masks for manufacturing pillar-shaped memory cells may be used with the present invention to create four times the number of memory cells 100 in the same space previously required for a single cell.

This is a substantial advantage of embodiments of the present invention in that memory cell density may be doubled or quadrupled without creating a need for new masks for word and bit lines or the need to scale the memory cell pillar structure which otherwise may cause a substantial increase of the cell resistance and/or decrease the cell current which affects the cell's power consumption/requirement.

In some embodiments, where scaling may or may not be used however, for example in embodiments that use larger diameter pillars, additional etch steps may be employed to further divide the pillar along other vertically oriented longitudinal planes to create more "pie slice"-shaped memory cells. For example, using two additional longitudinal etches that are approximately perpendicular to each other but rotated about forty-five degrees relative to the first two longitudinal etches, may be used to create a total of eight relatively densely arranged memory cells. Further, as shown in FIGS. 3 to 5, additional etching may be used to create even more "pie slice"-shaped memory cells.

Figure 3:
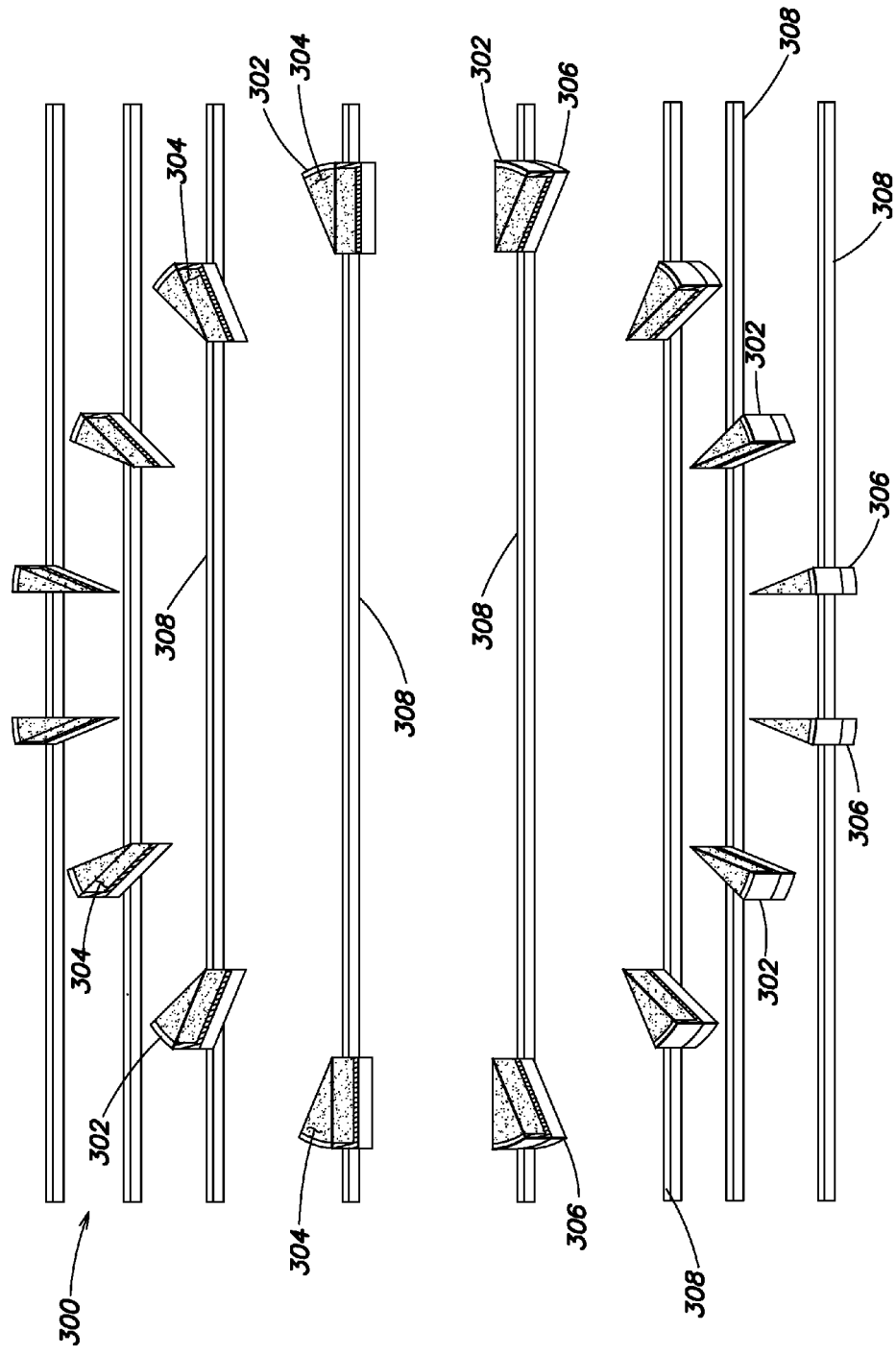
FIG. 3 is a perspective view of exemplary memory cells in accordance with this invention.

FIG. 3 depicts a perspective view of a pillar 300 that has been etched eight times to form sixteen independent "pie slice"-shaped memory cells that each include carbon material 302 (conformed onto the surface of a dielectric core 304) in series with a diode 306 (or other steering element) and coupled to a conductor 308. Note that the top conductors (310 in FIG. 5) have been omitted for clarity.

Figure 4:
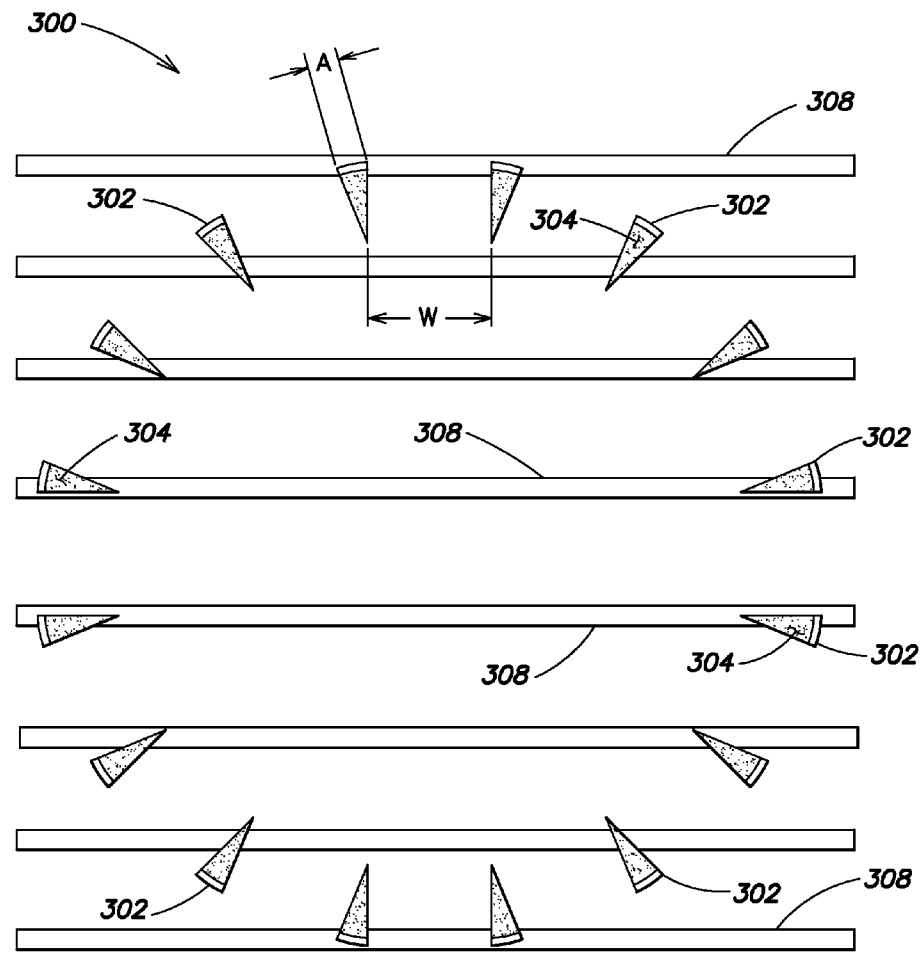
FIGS. 4-5 are top views of the memory cells of FIG. 3.
Figure 5:
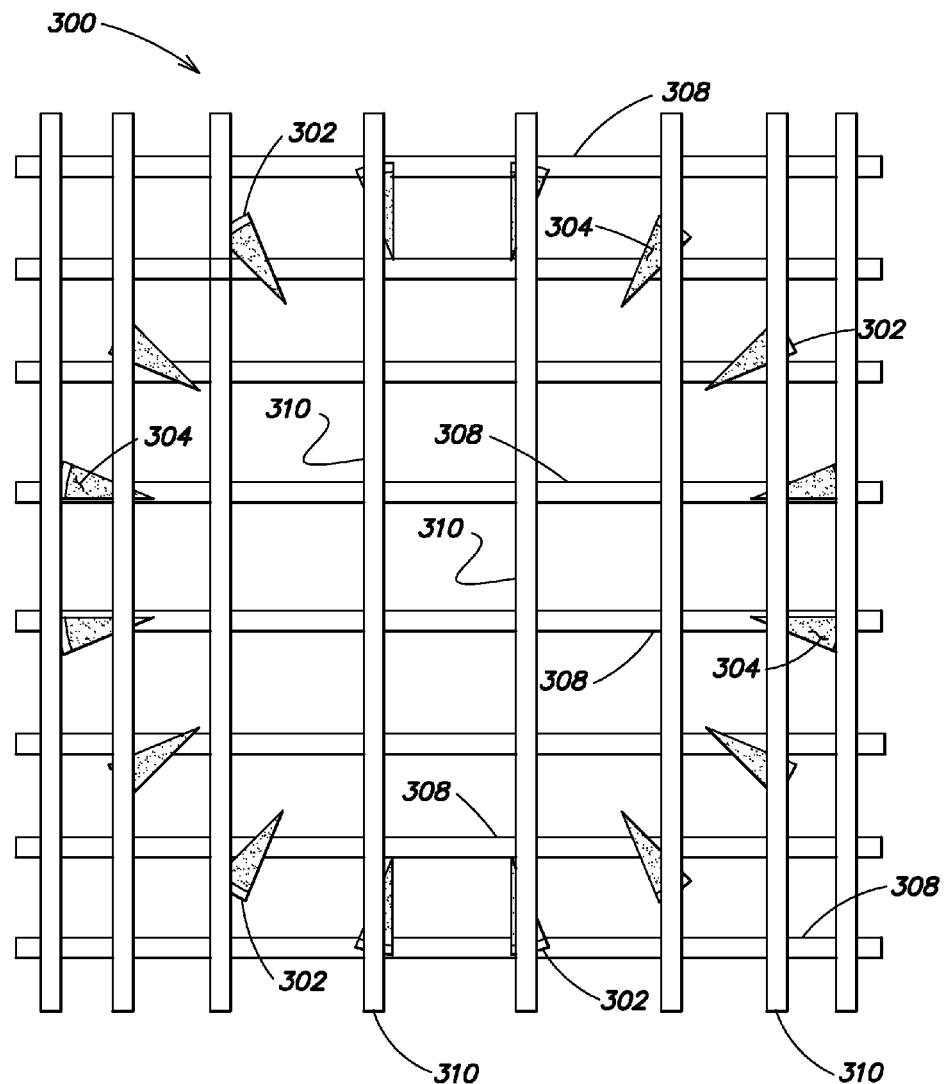

FIG. 4 depicts the same structure as FIG. 3 but from a top view perspective and FIG. 5 is the same top view but the top conductors 310 are represented. Note that only one memory cell is contacted by any one pair of bottom and top conductors 308, 310. In some embodiments, the bottom and top conductors 308, 310 may be spaced to align with the memory cells. Note that such embodiments or embodiments with additional independent "pie slice"-shaped memory cells may alternatively use multi-layer, staggered, and/or interwoven bit and word lines.

In some embodiments, the original diameter of the pillars 300 (before being etched into "pie slice"-shaped memory cells) may be approximately 30 nm or smaller based on the technology used to form the pillars. Presently available, cost efficient technology enables formation of pillars 300 with a diameter in the range of approximately 50 nm to approximately 1500 nm, and preferably in the range of approximately 50 nm to approximately 500 nm. Other practicable pillar diameters may be used.

In some embodiments, the height of the pillars 300 may be in the range of approximately 1000 A to approximately 5000 A, and preferably in the range of approximately 1200 A to approximately 2500 A. Other practicable pillar heights may be used. In some embodiments, the height of the diode 306 portion of the pillar 300 may be in the range of approximately 500 A to approximately 4000 A, and preferably in the range of approximately 1500 A to approximately 3000 A. Other practicable diode 306 heights may be used.

In some embodiments, the combined height of the carbon material 302 and dielectric 304 portion of the pillar 300 may be in the range of approximately 200 A to approximately 2000 A, and preferably in the range of approximately 400 A to approximately 1000 A. Other practicable carbon material 302 and dielectric 304 heights may be used.

In some embodiments, the trenches etched (or otherwise created) to form the pie-slice shaped memory cell pieces may have a width (e.g., labeled W in FIG. 4) in the range of approximately 5 nm to approximately 60 nm, and preferably in the range of approximately 10 nm to approximately 40 nm. Other practicable trench widths W may be used. For example, as with other dimensions, smaller widths may be used depending on the technology employed to form the trenches.

In some embodiments, the desired arc length (e.g., labeled A in FIG. 4) of the curved side of the individual pie-slice shaped pieces may be approximately 5 nm or smaller based on the technology used to form the pillars and to etch the trenches. Presently available, cost efficient technology enables formation of pie-slice shaped pieces with an arc length A in the range of approximately 3 nm to approximately 110 nm, and preferably in the range of approximately 10 nm to approximately 25 nm (starting with a pillar 300 with an approximately 30 nm diameter). Other practicable arc lengths A may be used.

In some embodiments, the number of pieces that the pillar 300 may be divided into is a function of the desired initial pillar 300 diameter, the desired trench width W, and the desired arc length A of the curved side of the individual pie-slice shaped pieces. For example, a 60 nm diameter pillar 300 would have a circumference of approximately 188 nm (c=π·d) which if etched with two trenches, each approximately 32 nm wide, would result in four pieces each with arc lengths of approximately 15 nm (≈¼[188 nm−(4·32 nm)]).

In another example, in order to form sixteen memory cells from one pillar 300, each memory cell having an arc length of approximately 5 nm, and the trench widths being approximately 5 nm, the initial diameter of the pillar may be approximately 50 nm (≈[(16·5 nm)+(16·5 nm)]/π).

Note that in these example calculations, the width W (which is actually the length of a cord instead of an arc along the circumference) is used as an approximation of the arc length of the trench along the circumference of the pillar.

In some embodiments, the "cross-talk" between the different pie-slice shaped memory cells may be prevented by choosing a gap fill material to fill the trenches that has a relatively small dielectric constant, for example in the range of approximately 1.5 to approximately 5 and preferably in the range of 2 and 3.5. Gap fill materials with other practicable dielectric constants may be used.

Turning back to FIG. 2A through 2I, methods of forming the etched pillar memory cells are now described. In accordance with one or more embodiments of the invention, novel integration schemes are provided which allow increased memory cell density of cells that use carbon films with an orientation which supports reversible resistivity-switching. For example, in some embodiments, a damascene process may be employed to form carbon films with a suitable "switching" orientation and then etching of these films may be performed to increase the density of the memory cells as mentioned above.

As described above, in some embodiments of the invention, thin carbon films may be integrated in series with a steering element, e.g., a vertical diode, to create a re-writable memory device. To achieve this, a carbon film may be vertically oriented between two metal layers or conductors, instead of horizontally oriented between two metal layers or conductors (e.g., such as in a metal-insulator-metal ("MIM") planar stack). Note that the steering element (e.g., diode) may be disposed above or below the vertical oriented carbon film and in some embodiments, steering elements may be disposed above and below the vertical carbon film.

With references to FIGS. 2A through 2I, in an exemplary process provided in accordance with the present invention, a first conductor 202, which may include, for example, a tungsten, copper, aluminum, or similar first conductive layer 204 and/or a TiN or similar appropriate barrier/adhesion layer 206, may be formed and/or patterned into approximately parallel conductor (e.g., word or bit) lines 202 on a substrate (not shown) or, in a three dimensional memory, other memory cell levels (not shown). For example, conductive layer 204 may have a thickness between about 1000 A and about 1500 A, and more generally between about 800 A and about 2500 A. Barrier/adhesion layer 206 may have a thickness between about 100 A and about 250 A, and more generally between about 50 A and about 400 A. A diode layer 208 may then be deposited.

Figure 2A:
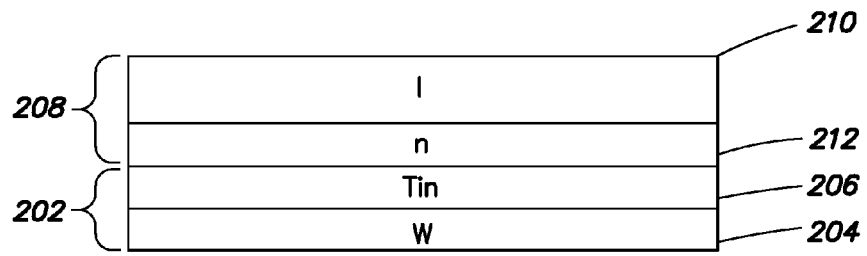
FIGS. 2A-2I illustrate cross-sectional views of a portion of a substrate during an exemplary fabrication of a single memory level in accordance with this invention.

As shown in FIG. 2A, a diode layer 208 may initially include, for example, an intrinsic region 210 and a negatively doped region 212. Intrinsic region 210 may have a thickness between about 800 A and about 1200 A, and more generally between about 600 A and about 1900 A. Negatively doped region 212 may have a thickness between about 100 A and about 300 A, and more generally between about 90 A and about 350 A.

Figure 2B:
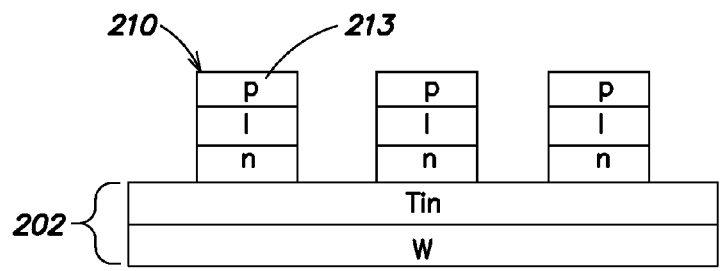
Figure 2B:
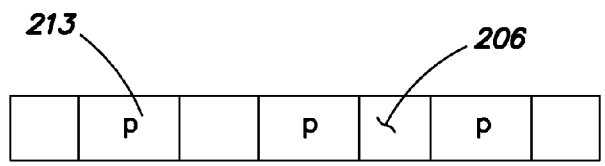

In some embodiments, the diode layer 208 may be patterned to form diode pillars on the conductor lines 202 as shown in FIG. 2B (and FIG. 2B' top view). Note that only one row of three pillars on one line 202 is depicted in the drawings and one familiar with the art would understand that this depiction is intended to represent any number of rows each on a corresponding line with any number of pillars per row arranged in a consistently spaced array.

Figure 2C:
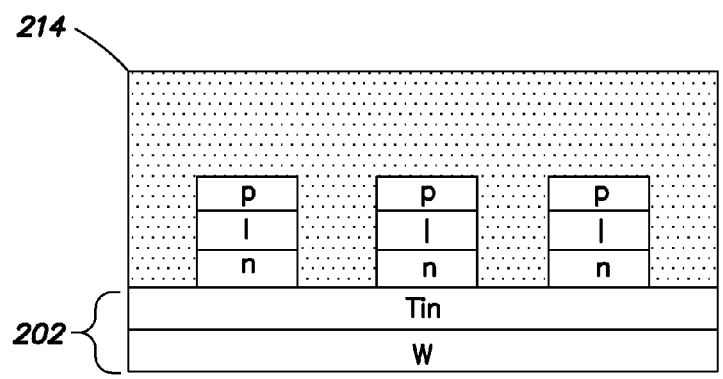

A top portion of the intrinsic region 210 may be positively doped to form a P region 213, also as shown in FIG. 2B. The structure may be coated and gap filed with a first insulating material 214 such as silicon dioxide, silicon nitride, a low k dielectric, etc., as shown in FIG. 2C. For example, between about 400 A and about 1000 A, more generally between about 200 A and about 2000 A, of insulating material 214 may be deposited.

In some embodiments, if diode 106 is fabricated from deposited silicon (e.g., amorphous or polycrystalline), a silicide layer (not shown) may be formed on diode 106 as seeds to facilitate the crystallization of the diode 106. Therefore, the deposited silicon is in a low resistivity state, as fabricated. Such a low resistivity state allows for easier programming of memory cell 100 as a large voltage is not required to switch the deposited silicon to a low resistivity state. For example, a silicide-forming metal layer (not shown) such as titanium or cobalt may be deposited on P region 213.

In some embodiments, an additional nitride layer (not shown) may be formed at a top surface of the silicide-forming metal layer. In particular, for highly reactive metals, such as titanium, an additional cap layer such as TiN layer may be formed on the silicide-forming metal layer. Thus, in such embodiments, a Ti/TiN stack is formed on top of P region 213.

A rapid thermal anneal ("RTA") step may then be performed to form silicide regions by reaction of the silicide-forming metal layer with P region 213. The RTA may be performed at about 540° C. for about 1 minute, and causes the silicide-forming metal layer and the deposited silicon of diode 106 to interact to form a silicide layer, consuming all or a portion of the silicide-forming metal layer.

As described in U.S. Pat. No. 7,176,064, titled "Memory Cell Comprising A Semiconductor Junction Diode Crystallized Adjacent To A Silicide," which is hereby incorporated by reference herein in its entirety for all purposes, silicide-forming materials such as titanium and/or cobalt react with deposited silicon during annealing to form a silicide layer.

The lattice spacing of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of silicon diode 106 during annealing). Lower resistivity silicon thereby is provided. Similar results may be achieved for silicon-germanium alloy and/or germanium diodes.

In embodiments in which a nitride layer was formed at a top surface of the silicide-forming metal layer, following the RTA step, the nitride layer may be stripped using a wet chemistry. For example, if the silicide-forming metal layer includes a TiN top layer, a wet chemistry (e.g., ammonium, peroxide, water in a 1:1:1 ratio) may be used to strip any residual TiN.

Figure 2D:
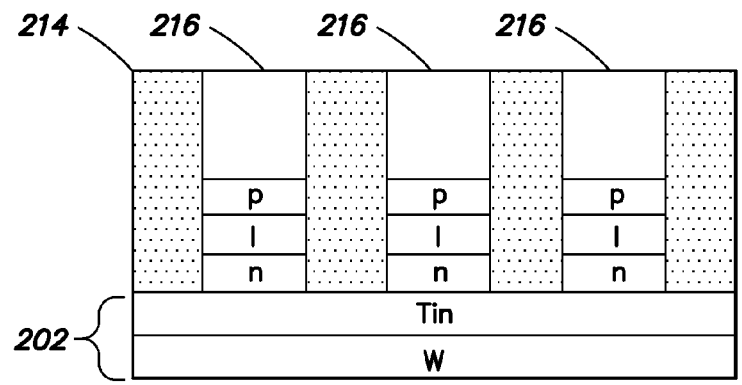
Figure 2E:
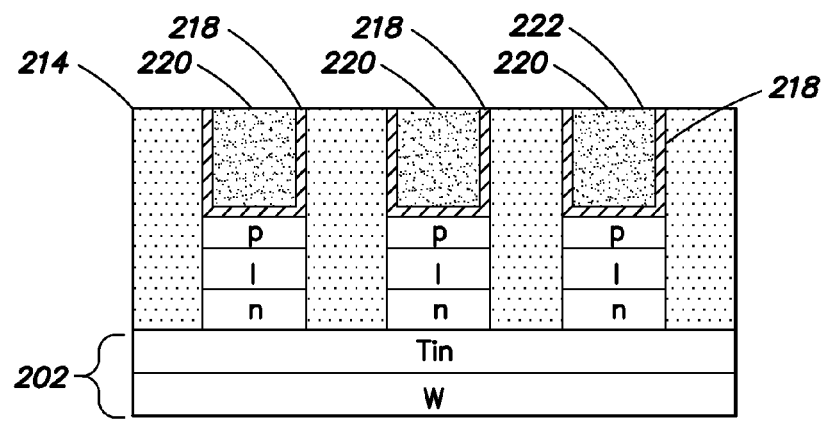
Figure 2E:
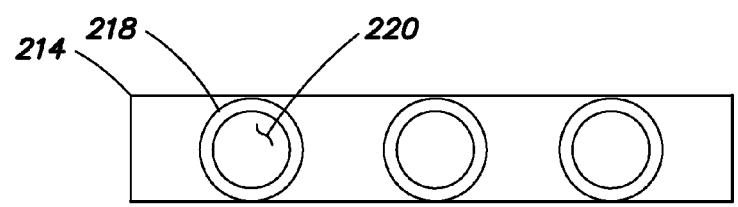

A trench, via or similar feature 216 may be formed in the first insulating material 214 above the diode pillars, as shown in FIG. 2D and carbon material 218 may be deposited in the feature 216 and on the side walls of the feature 216 as shown in FIG. 2E (and top view 2E').

For example, a carbon film 218 may be deposited on the bottom and sidewall regions of the feature 216, as well as on the (top) field regions of the first insulating material 214. Deposition on the sidewalls of the feature 216 allows the desired orientation of the carbon film 218 to be attained. Exemplary feature widths are about 20-130 nanometers and exemplary feature heights are about 0.1-2.6 microns, although other sizes may be used.

In some embodiments, to create the via, trench or similar feature 216 in the insulating material 214, a germanium, amorphous carbon or otherwise controllably etchable material is deposited, patterned and etched into a pillar (not shown). Insulating material 214 is subsequently deposited around the germanium pillar and planarized by an etch back process, chemical mechanical polishing ("CMP") or the like.

The insulating material 214 may be, for example, $SiO_2$, $Si_3N_4$, or any other suitable insulating and/or dielectric material. After planarization, the germanium pillar may be removed with an ashing or other etching technique to generate the feature 216 in the insulating material 214.

After the feature 216 is formed, the carbon film 218 is deposited. The carbon film 218 may be deposited by any suitable technique such as Chemical Vapor Deposition ("CVD"), High Density Plasma deposition ("HDP"), plasma enhanced CVD ("PECVD"), sputter deposition from an amorphous or graphite target, etc. In some embodiments, post deposition treatment(s) may be employed such as annealing in reduced pressure or oxygen environments to affect or otherwise improve the properties of the carbon film 218. Likewise, passivation of the carbon film 218 with SiN/SiON while maintaining a vacuum may be used to avoid moisture adsorption and interaction between the insulating material 214 and the carbon 218. To improve sidewall coverage, a conformal deposition process may be used in one or more embodiments.

In some exemplary embodiments, a carbon film thickness of about one monolayer to about 1000 A, and more preferably about 400 A to about 600 A, at the sidewalls of the feature 216 may be employed. Other thickness may be used.

In these or other embodiments, the interface between the carbon film 218 and the insulating material 214, such as at the sidewalls of the feature 216, may be modified to improve adhesion between the carbon film 218 and the insulating material 214. For example, carbon material deposition parameters may be adjusted so that a thin region of the carbon film 218, such as a few monolayers, in contact with the insulating material 214 is $sp^3$ rich rather than $sp^2$ rich (as may be preferred for the remainder of the carbon film 218 in some embodiments).

Additionally or alternatively, a thin "capping" layer of atomic layer deposition ("ALD"), CVD or PECVD silicon dioxide, silicon nitride, etc., may be deposited between the carbon film 218 and the insulating material 214 to improve adhesion. Exemplary capping layer thicknesses are about 50 to about 800 A, although other thickness ranges may be used.

In some embodiments, following formation of carbon film 218, an anneal step may be performed prior to depositing additional material. In particular, the anneal may be performed in a vacuum or the presence of one or more forming gases, at a temperature in the range from about 450° C. to about 1200° C., for about 60 sec to about 5 hours. The anneal preferably is performed in about an 80% ($N_2$):20% ($H_2$) mixture of forming gases, at about 625° C. for about one hour.

Suitable forming gases may include one or more of $N_2$, Ar, and $H_2$, whereas preferred forming gases may include a mixture having above about 75% $N_2$ or Ar and below about 25% $H_2$. Alternatively, a vacuum may be used. Suitable temperatures may range from about 200° C. to about 1200° C., whereas preferred temperatures may range from about 500° C. to about 650° C. Suitable durations may range from about 60 seconds to about 5 hours, whereas preferred durations may range from about 1 hour to about 1.5 hours. Suitable pressures may range from about 1 mT to about 760 T, whereas preferred pressures may range from about 300 mT to about 600 mT.

A queue time of preferably about 2 hours between the anneal and the deposition of additional layers preferably accompanies the use of the anneal. A ramp up duration may range from about 0.2 hours to about 1.2 hours and preferably is about 0.5 Similarly, in some embodiments, a ramp down duration also may range from about 0.2 hours to about 1.2 hours and preferably is about 0.5 hours.

Although not wanting to be bound by any particular theory, it is believed that carbon-based material may absorb water from the air over time and/or during a wet clean process. Likewise, it is believed that the moisture may increase the likelihood of de-lamination of the carbon-based material, and degradation in switching. In some cases, it also might be acceptable to have a queue time of 2 hours from the time of deposition of carbon-based material to deposition of additional layers, skipping the anneal altogether. In some cases, in-situ annealing or degas in a vacuum may be used to help to drive out moisture before the next process step.

In particular, the in-situ anneal or degas in vacuum is performed in the chamber of the next processing step. Degas in vacuum may also be performed in a transfer chamber or loadlock mounted on the same platform as the process chamber. For example, if the next processing step is formation of a sidewall liner, the in-situ anneal is performed in the chamber used to form the sidewall liner. The in-situ anneal may be performed at a temperature between about 200° C. and about 350° C., more generally between about 200° C. and about 450° C., for a duration between about 1 minute to about 2 minutes, more generally between about 30 seconds and about 5 minutes, at a pressure of between about 0.1 mT to about 10 T, more generally between about 0.1 mT to about 760 T. Alternatively, the in-situ anneal may be performed in an environment containing Ar, He, or $N_2$, or a forming gas containing $H_2$ and $N_2$, at a flow rate of between about 1000 sccm to about 8000 sccm, more generally between about 1000 sccm and about 20000 sccm. If degas in vacuum step is used instead of in-situ annealing, the degas is performed at a pressure between about 0.1 mT to about 50 ml, and at a temperature between about room temperature to about 450° C.

Incorporation of such a post-carbon-formation-anneal preferably takes into account other layers of the memory cell, because these other memory cell layers will also be subject to the anneal. For example, the anneal may be omitted or its parameters may be adjusted where the aforementioned preferred anneal parameters would damage the other memory cell layers. The anneal parameters may be adjusted within ranges that result in the removal of moisture without damaging the layers of the annealed memory cell.

For instance, the temperature may be adjusted to stay within an overall thermal budget of a memory cell being formed. Likewise, any suitable forming gases, temperatures and/or durations may be used that are appropriate for a particular memory cell. In general, such an anneal may be used with any carbon-based layer or carbon-containing material, such as layers having CNT material, graphite, graphene, amorphous carbon, etc.

Following formation of the carbon film 218, second dielectric or other insulating material 220 is then deposited onto the carbon film 218 to fill the feature 216 as shown in FIG. 2E (top view 2E'). For example, between about 400 Å and about 1200 Å, more generally between about 200 Å and about 2200 Å of insulating material 220 may be deposited. Subsequent CMP or etch back may be employed to remove the second dielectric material 220 and the carbon film 218 from the field region of the first dielectric material 214, forming a planar surface 222 for the structure, and exposing the upper edges of the carbon film 218 on the sidewalls of the feature 216 as shown in FIGS. 2E and 2E'.

In general, excess deposited carbon material, such as carbon material on the field region of the first insulating material 214, may be removed by etch back, CMP or any suitable process. In this manner, only the sidewalls and/or the bottom of the feature 216 are coated with the carbon film 218. The second dielectric material 220 may be deposited by CVD, HDP, spin-on techniques or the like. The second dielectric material 220 may be $SiO_2$, $Si_3N_4$, any combination thereof, or any other suitable dielectric or insulating material.

In these or other embodiments, the interface between the carbon film 218 and the second insulating material 220 may be modified to improve adhesion between the carbon film 218 and the second insulating material 220. For example, carbon material deposition parameters may be adjusted so that a thin region of the carbon film 218, such as a few monolayers, in contact with the insulating material 220 is $sp^3$ rich rather than $sp^2$ rich (as may be preferred for the remainder of the carbon film 218 in some embodiments).

Additionally or alternatively, a thin "capping" layer of ALD, CVD or PECVD silicon dioxide, silicon nitride, etc., may be deposited between the carbon film 218 and the second insulating material 220 to improve adhesion. Exemplary capping layer thicknesses are about 50-800 angstroms, although other thickness ranges may be used. Following planarization of the structure, a hardmask (not shown) such as amorphous Si or TiN, may be deposited and patterned on the structure to be used to etch a first set of parallel trenches down though the pillars to the first conductors 202. A highly directional anisotropic etch (similar to a spacer etch) may be used to etch off the bottom layer of the carbon film 218.

A third insulating material 224 is then used to gap fill the etched trench and the top surface may be planarized again. At this point, with the original pillars each etched into two distinct memory cells, a top conductive layer may be deposited and double patterned into top conductor lines approximately perpendicular to the bottom conductor lines 202 to form a double density memory array.

Alternatively, in some embodiments, a second hardmask (not shown), such as amorphous Si or TiN and rotated ninety degrees from the first hardmask, may be deposited and patterned on the structure (before the top conductor lines are formed) to be used to etch a second set of parallel trenches down though the pillars to the first conductors 202. Note that the second set of parallel trenches are etched approximately perpendicular to the first set of parallel trenches.

Figure 2F:
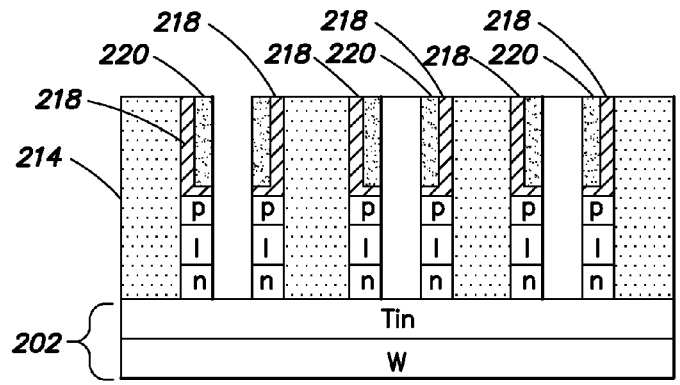
Figure 2F:
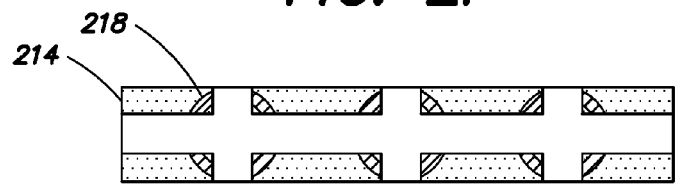
Figure 2G:
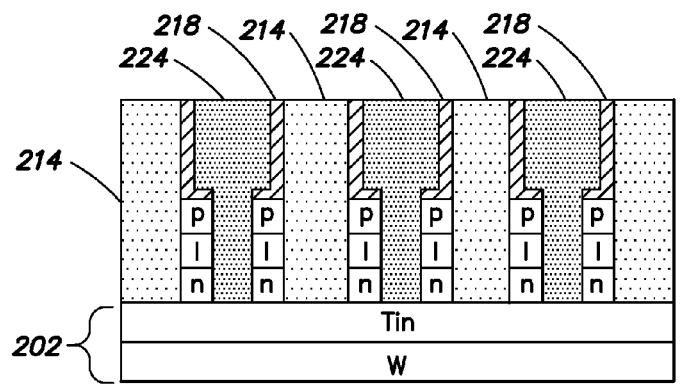
Figure 2G:
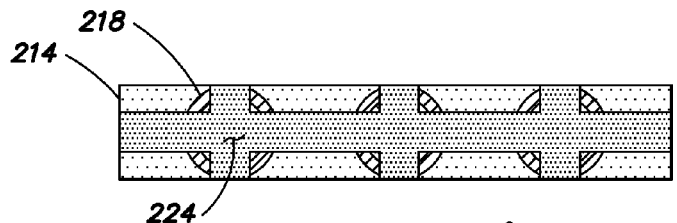

In such embodiments, the original pillars are each etched into four distinct memory cells. FIG. 2F (and top view 2F') depicts the pillars etched in two perpendicular directions. In some embodiments, a single hardmask and a single etching step may be used to etch each of the pillars into four memory cells as depicted in FIG. 2F'. The third insulating material 224 is then used to gap fill the etched trench(es) and the top surface may be planarized again as shown in FIG. 2G.

Figure 2H:
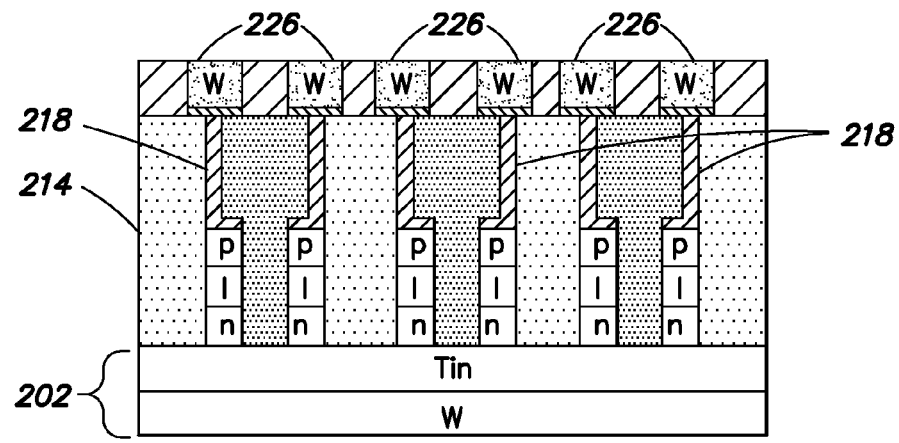

As shown in FIG. 2H, at this point, with the original pillars each etched into two or four distinct memory cells, a top conductive layer (e.g., a tungsten, copper, aluminum, or similar conductive layer and/or a TiN or similar appropriate barrier/adhesion layer) may be deposited (e.g., using a damascene process), double patterned into top conductor lines 226 approximately perpendicular to the bottom conductor lines 202 to form a double or quadruple density memory array.

Note that in the depicted quadruple density embodiment, the bottom conductor lines 202 may also be double patterned to provide an appropriate number of conductors for the additional memory cells created by the present invention. In at least one embodiment, the first and second conductors 202, 226 may be rail conductors that extend in different directions (e.g., substantially perpendicular).

Figure 2I:
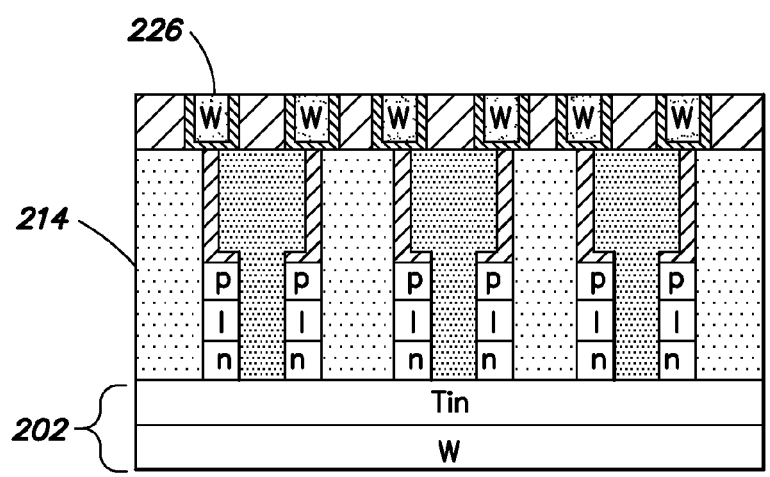

FIG. 2I depicts an alternative conductor 226 structure that may be employed with the present invention. The conductor 226 structure depicted in FIG. 2H is suitable for relatively large geometry conductor lines. In this embodiment, TiN/W layers are blanket deposited, patterned using a metal etch process, and then gap-filled with dielectric.

In contrast, the conductor 226 structure depicted in FIG. 2I is suitable for relatively small geometry conductor lines which may be particularly useful with the increased density memory cells of the present invention. In this embodiment, a dielectric film is initially blanket deposited, the film is patterned using a dielectric etch process, a conformal TiN liner is deposited, and then a W layer is deposited. In some embodiments, either or both of the bottom and top conductors 202, 226 may be formed using either of the two conductor structures depicted in FIGS. 2H and 2I.

Following formation of top conductors 226, the resultant structure may be annealed to crystallize the deposited semiconductor material of diodes 106 (and/or to form silicide regions by reaction of the silicide-forming metal layer with P region 213). The lattice spacing of titanium silicide and cobalt silicide are close to that of silicon, and it appears that the silicide layers may serve as "crystallization templates" or "seeds" for adjacent deposited silicon as the deposited silicon crystallizes (e.g., the silicide layer may enhance the crystalline structure of silicon diode 106 during annealing at temps of about 600-800° C.). Lower resistivity diode material thereby is provided. Similar results may be achieved for silicon-germanium alloy and/or germanium diodes.

Thus in at least one embodiment, a crystallization anneal may be performed for about 10 seconds to about 2 minutes in nitrogen at a temperature of about 600 to 800° C., and more preferably between about 650 and 750° C. Other annealing times, temperatures and/or environments may be used.

Using embodiments of the present invention, a metal-graphitic carbon-metal ("MGCM") structure with double or quadruple density may be formed. Within the MGCM structure, conduction between the conductors 202, 226 may occur along vertically oriented carbon material which coats the sidewalls of the feature 216. As such, conduction may occur along the length of the carbon pi bonds of the carbon film 218, and resistivity switching may be observed. Further, such a structure reduces the likelihood of an inadvertent vertical short between the top and bottom conductors 202, 226.

In accordance with one or more embodiments of the invention, vertically oriented carbon material may be employed within the memory cells of a memory array. For example, the MGCM structure described above, or a similar carbon-based resistivity switching element, may be placed in series with a steering element to form a memory cell and the memory cell may be etched into two or four or more memory cells.

As schematically represented in FIGS. 6A through 6D, in an additional embodiment, the present invention provides a memory cell structure 600 and a manufacturing process for a carbon-based memory element. As with the above described embodiments, the methods of the present invention may be used with carbon material 602 that may be conformably deposited on the sidewalls of a memory cell pillar-shaped structure formed with a dielectric 604 core. The carbon material 602 is connected in series with a diode 606 (or other steering element) between conductors 608 and 610. Diode 606 may be a vertical p-n or p-i-n diode.

In some embodiments, any rectifier device may be used in place of diode 606. In some embodiments, diode 606 may be formed from a polycrystalline semiconductor material such as polysilicon, a polycrystalline silicon-germanium alloy, polygermanium or any other suitable material. According to the present invention, the carbon material 602 of the memory cell pillar structure whose sidewalls upon which the carbon-material 602 is conformably deposited, is etched (e.g., using a highly anisotropic etch such as spacer etch) along a vertically oriented, longitudinal plane which effectively bisects the carbon material 602 portion of the pillar lengthwise into two independent memory cells that share a diode layer 606 in the same space previously occupied by a single memory cell.

This partial etch process thus increases the memory cell density by two times without any scaling of the pillar structure and without having to etch through the diode layer 606. As shown in FIG. 6B, by repeating the partial etching along a second vertically oriented, longitudinal plane that is approximately perpendicular to the plane of the first partial etch, the pillar may be divided into a total of four independent memory cells in the same space previously occupied by a single memory cell.

Figure 6A:
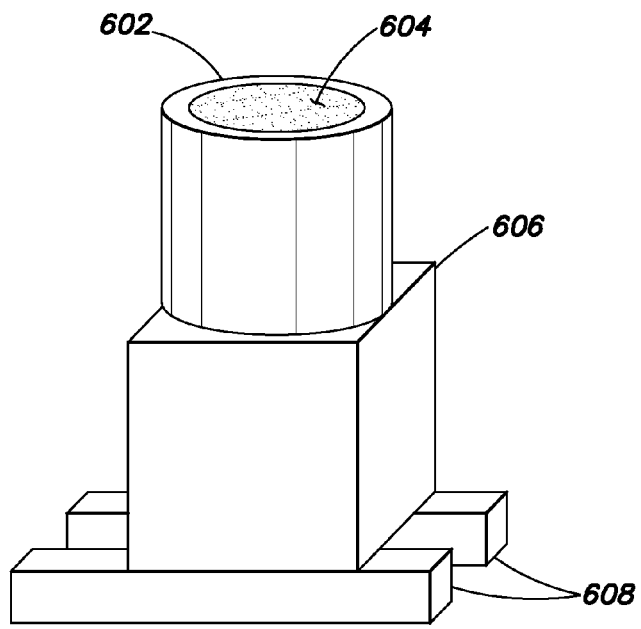
FIG. 6A is an exemplary memory cell.
Figure 6B:
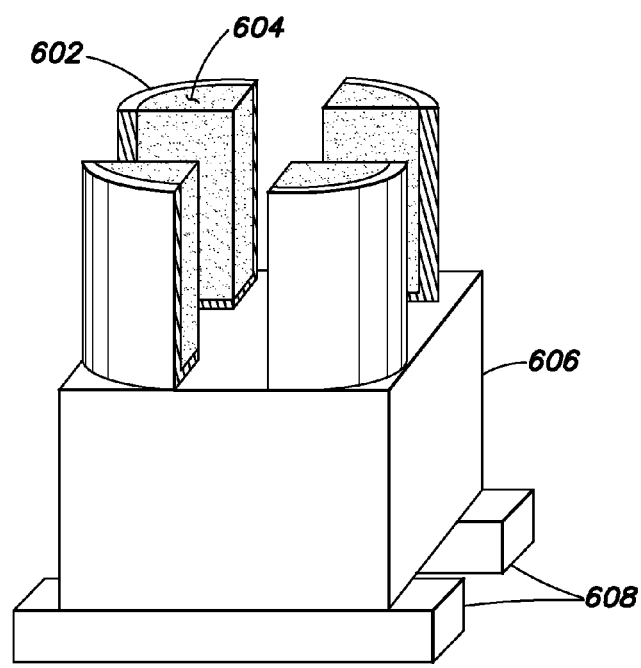
FIGS. 6B-6C are perspective views of exemplary memory cells in accordance with this invention.
Figure 6C:
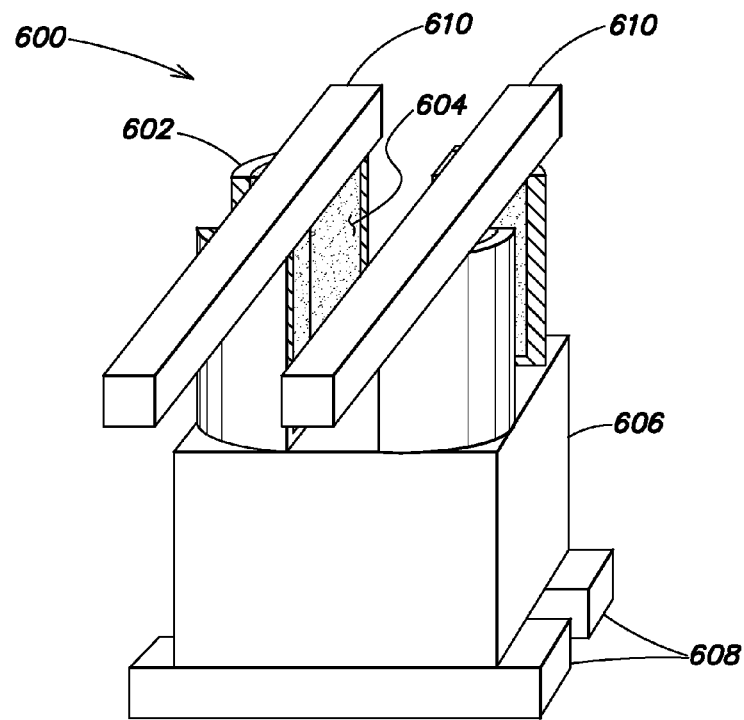
Figure 6D:
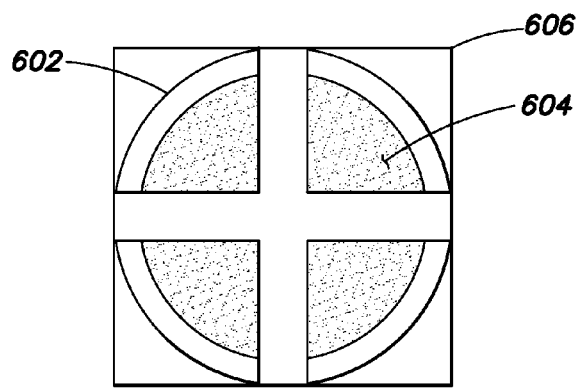
FIG. 6D is a top view of the memory cells of FIG. 6B.

Thus, these two partial etch processes together (as represented by FIG. 6A before and FIG. 6B after the partial etching to the diode layer 606) may be employed to increase the memory cell density by four times. Note that FIG. 6C is the same as FIG. 6B except the conductors 610 are included in FIG. 6C. FIG. 6D depicts a top view of the double partial etched memory cells 600 with the conductors omitted for clarity.

In some embodiments, the height of the memory cells 600 may be in the range of approximately 1000 A to approximately 5000 A, and preferably in the range of approximately 1200 A to approximately 2500 A. Other practicable heights may be used. In some embodiments, the height of the diode 606 portion of the memory cell 600 may be in the range of approximately 500 A to approximately 4000 A, and preferably in the range of approximately 800 A to approximately 2500 A. Other practicable diode 606 heights may be used.

In some embodiments, the combined height of the carbon material 602 and dielectric 604 portion of the memory cell 600 may be in the range of approximately 200 A to approximately 2000 A, and preferably in the range of approximately 400 A to approximately 1000 A. Other practicable carbon material 602 and dielectric 604 heights may be used.

As indicated above, to access the "two times" more densely arranged memory cells (i.e., a single etched cell), either the word or bit lines (e.g., metal lines 608, 610 that connect to opposite ends of the memory cells 600 for reading and writing the cells) may be double patterned (to increase the number of lines in a given area to match the more densely arranged memory cells). To access the "four times" more densely arranged memory cells 600 (i.e., double etched cells), both the word and bit lines may be double patterned.

Thus, existing masks for manufacturing pillar-shaped memory cells may be used with the present invention to create four times the number of memory cells 600 in the same space previously required for a single cell. This is a substantial advantage of embodiments of the present invention in that memory cell density may be doubled or quadrupled without creating a need for new masks for word and bit lines or the need to scale the memory cell pillar structure which otherwise may cause a substantial increase of the cell resistance and/or decrease the cell current which affects the cell's power consumption/requirement.

In some embodiments, where scaling may or may not be used however, for example in embodiments that use larger diameter pillars, additional partial etch steps may be employed to further divide the carbon material 602 portion of the pillar along other vertically oriented longitudinal planes to create more "pie slice"-shaped memory cells.

For example, using two additional longitudinal partial etches that are approximately perpendicular to each other but rotated about forty-five degrees relative to the first two longitudinal partial etches, may be used to create a total of eight relatively densely arranged memory cells.

Figure 9:
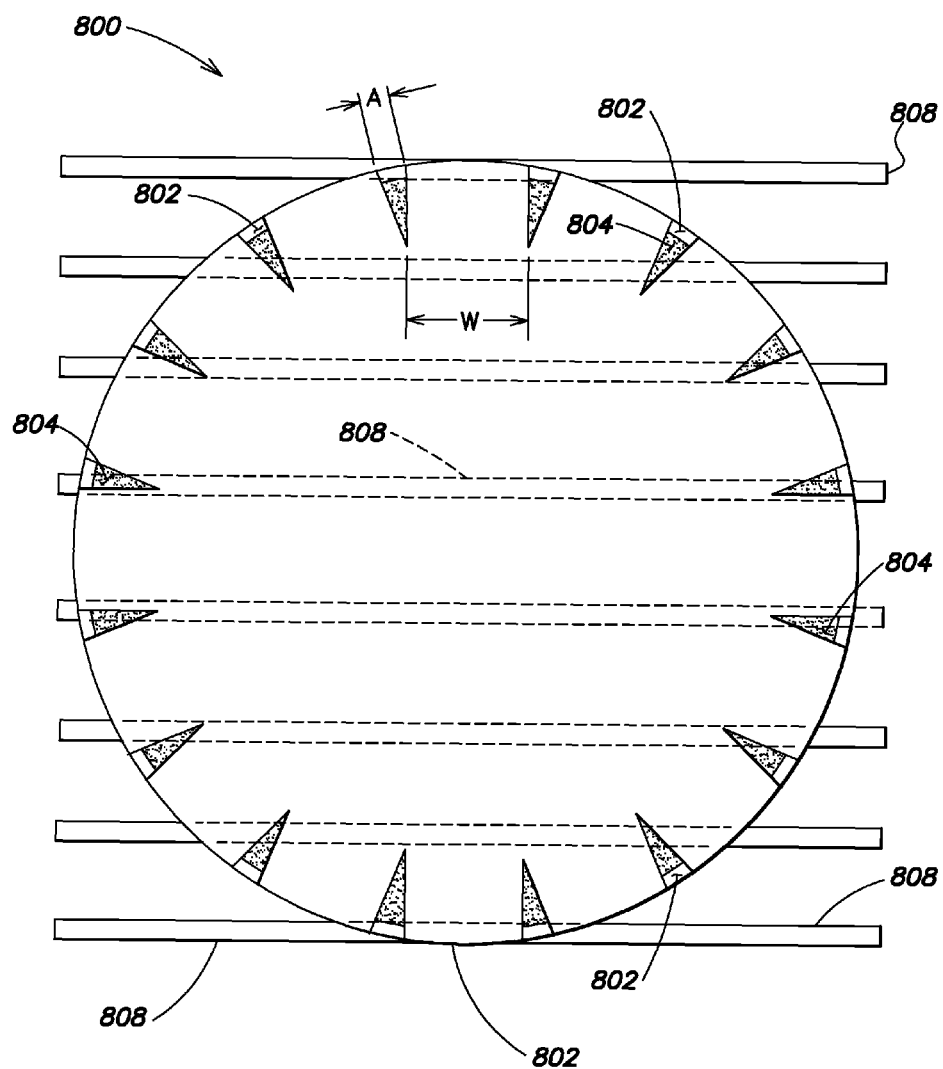
FIGS. 9-10 are top views of the memory cells of FIG. 8.
Figure 10:
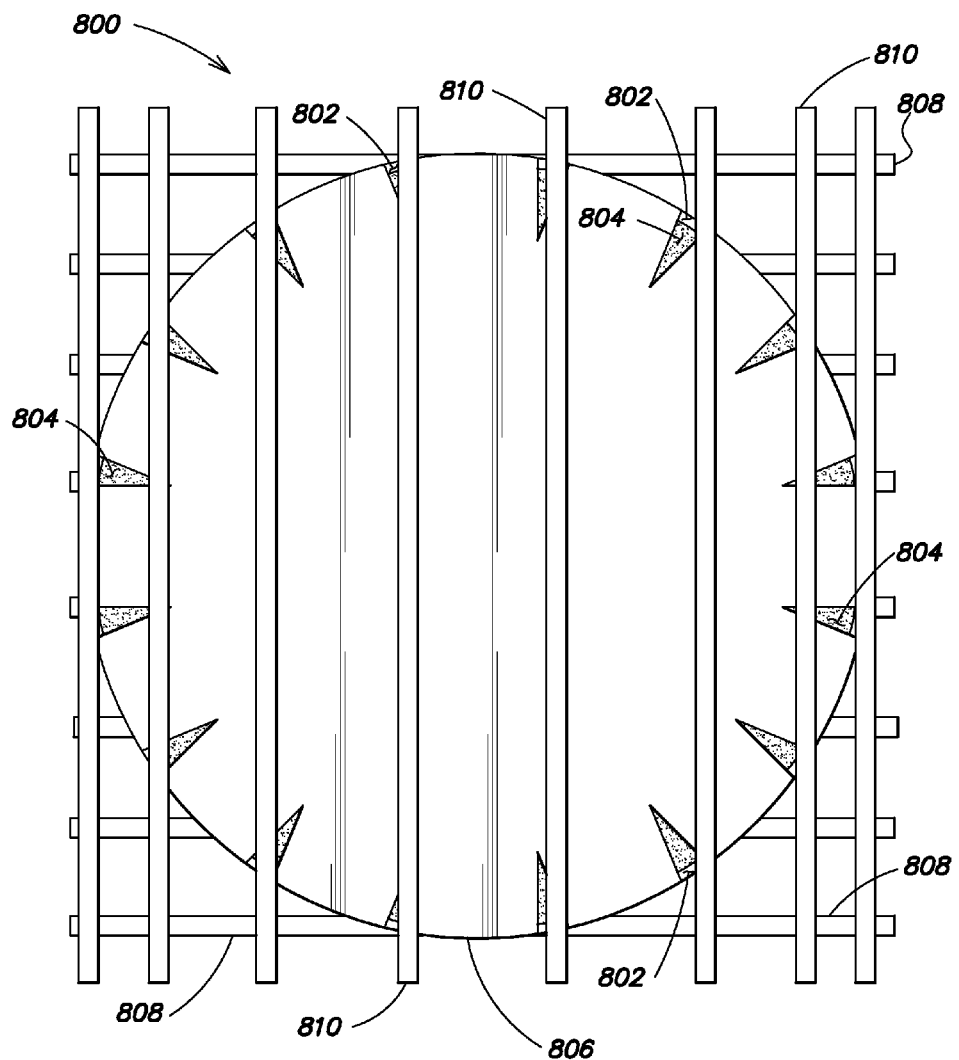

Further, as shown in FIGS. 8 to 10, additional partial etching may be used to create even more "pie slice"-shaped memory cells. FIG. 8 depicts a perspective view of a pillar 800 that has been etched eight times to form sixteen independent "pie slice"-shaped memory cells that each include carbon material 802 (conformed onto the surface of a dielectric core 804) in series with a diode 806 (or other steering element) and coupled to a conductor 808. Note that the top conductors (810 in FIG. 9) have been omitted for clarity.

FIG. 9 depicts the same structure as FIG. 8 but from a top view perspective and FIG. 10 is the same top view but the top conductors 810 are represented. Note that only one memory cell is contacted by any one pair of bottom and top conductors 808, 810. In some embodiments, the bottom and top conductors 808, 810 may be spaced to align with the carbon portion of the memory cells. Note that such embodiments or embodiments with additional independent "pie slice"-shaped carbon portions may alternatively use multi-layer, staggered, and/or interwoven bit and word lines.

In some embodiments, the original diameter of the pillars 800 (before being partially etched into "pie slice"-shaped memory cells) may be approximately 30 nm or smaller based on the technology used to form the pillars. Presently available, cost efficient technology enables formation of pillars 800 with a diameter in the range of approximately 50 nm to approximately 1500 nm, and preferably in the range of approximately 50 nm to approximately 500 nm. Other practicable pillar diameters may be used.

In some embodiments, the height of the pillars 800 may be in the range of approximately 1000 A to approximately 5000 A, and preferably in the range of approximately 1200 A to approximately 2500 A. Other practicable pillar heights may be used. In some embodiments, the height of the diode 806 portion of the pillar 800 may be in the range of approximately 500 A to approximately 4000 A, and preferably in the range of approximately 1500 A to approximately 3000 A. Other practicable diode 806 heights may be used.

In some embodiments, the combined height of the carbon material 802 and dielectric 804 portion of the pillar 800 may be in the range of approximately 200 A to approximately 2000 A, and preferably in the range of approximately 400 A to approximately 1000 A. Other practicable carbon material 802 and dielectric 804 heights may be used.

In some embodiments, the trenches etched (or otherwise created) to form the pie-slice shaped memory cell pieces may have a width (e.g., labeled W in FIG. 9) in the range of approximately 5 nm to approximately 60 nm, and preferably in the range of approximately 10 nm to approximately 40 nm. Other practicable trench widths W may be used. For example, as with other dimensions, smaller widths may be used depending on the technology employed to form the trenches.

In some embodiments, the desired arc length (e.g., labeled A in FIG. 9) of the curved side of the individual pie-slice shaped pieces may be approximately 5 nm or smaller based on the technology used to form the pillars and to etch the trenches. Presently available, cost efficient technology enables formation of pie-slice shaped pieces with an arc length A in the range of approximately 3 nm to approximately 110 nm, and preferably in the range of approximately 10 nm to approximately 25 nm (starting with a pillar 800 with an approximately 30 nm diameter). Other practicable arc lengths A may be used.

In some embodiments, the number of pieces that the carbon material 802 portion of the pillar 800 may be divided into is a function of the desired initial pillar 800 diameter, the desired trench width W, and the desired arc length A of the curved side of the individual pie-slice shaped pieces. For example, a 60 nm diameter pillar 800 would have a circumference of approximately 188 nm (c=π·d) which if partially etched with two trenches, each approximately 32 nm wide, would result in four pieces each with arc lengths of approximately 15 nm ($\approx \frac{1}{4}$[188 nm-(4·32 nm)]).

In another example, in order to form sixteen memory cells from one pillar 800, each memory cell having an arc length of approximately 5 nm, and the trench widths being approximately 5 nm, the initial diameter of the pillar may be approximately 50 nm ($\approx$[(16·5 nm)+(16·5 nm)]/π).

Note that in these example calculations, the width W (which is actually the length of a cord instead of an arc along the circumference) is used as an approximation of the arc length of the trench along the circumference of the pillar.

In some embodiments, the "cross-talk" between the different pie-slice shaped carbon material 802 portions of the memory cells may be prevented by choosing a gap fill material to fill the trenches that has a relatively small dielectric constant, for example in the range of approximately 1.5 to approximately 5 and preferably in the range of 2 and 3.5. Gap fill materials with other practicable dielectric constants may be used.

Turning back to FIG. 7A through 7I, methods of forming the partially etched pillar memory cells are now described. In accordance with one or more embodiments of the invention, novel integration schemes are provided which allow increased memory cell density of cells that use carbon films with an orientation which supports reversible resistivity-switching. For example, in some embodiments, a damascene process may be employed to form carbon films with a suitable "switching" orientation and then etching of these films may be performed to increase the density of the memory cells as mentioned above.

As described above, in some embodiments of the invention, thin carbon films may be integrated in series with a steering element, e.g., a vertical diode, to create a re-writable memory device. To achieve this, a carbon film may be vertically oriented between two metal layers or conductors, instead of horizontally oriented between two metal layers or conductors (e.g., such as in a MIM planar stack). Note that the steering element (e.g., diode) may be disposed above or below the vertical oriented carbon film and in some embodiments, steering elements may be disposed above and below the vertical carbon film.

With references to FIGS. 7A through 7I, in an exemplary process provided in accordance with the present invention, a first conductor 702, which may include, for example, a tungsten, copper, aluminum, or similar first conductive layer 704 and/or a TiN or similar appropriate barrier/adhesion layer 706, may be formed and/or patterned into approximately parallel conductor (e.g., word or bit) lines 702 on a substrate (not shown) or, in a three dimensional memory, other memory cell levels (not shown).

For example, conductive layer 704 may have a thickness between about 1000 A and about 1500 A, and more generally between about 800 A and about 2500 A. Barrier/adhesion layer 706 may have a thickness between about 100 A and about 250 A, and more generally between about 50 A and about 400 A. A diode layer 708 may then be deposited.

Figure 7A:
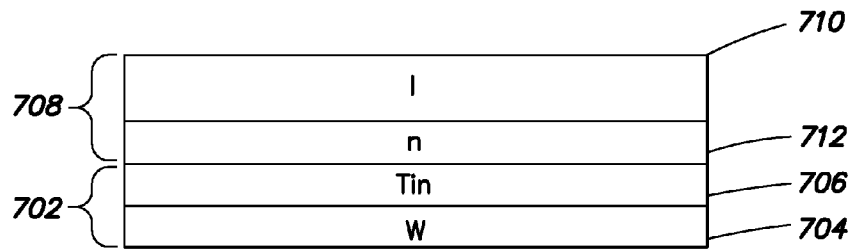
FIGS. 7A-7I illustrate cross-sectional views of a portion of a substrate during an exemplary fabrication of a single memory level in accordance with this invention.

As shown in FIG. 7A, a diode layer 708 may initially include, for example, an intrinsic region 710 and a negatively doped region 712. Intrinsic region 710 may have a thickness between about 800 A and about 1200 A, and more generally between about 600 A and about 1900 A. Negatively doped region 712 may have a thickness between about 100 A and about 300 A, and more generally between about 90 A and about 350 A.

Figure 7B:
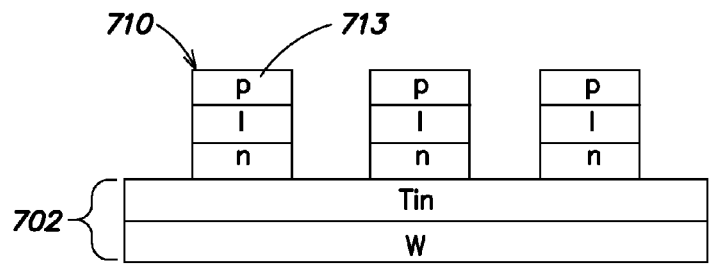
Figure 7B:
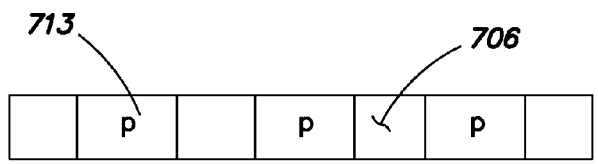

In some embodiments, the diode layer 708 may be patterned to form diode pillars on the conductor lines 702 as shown in FIG. 7B (and FIG. 7B' top view). Note that only one row of three pillars on one line 702 is depicted in the drawings and one familiar with the art would understand that this depiction is intended to represent any number of rows each on a corresponding line with any number of pillars per row arranged in a consistently spaced array.

Figure 7C:
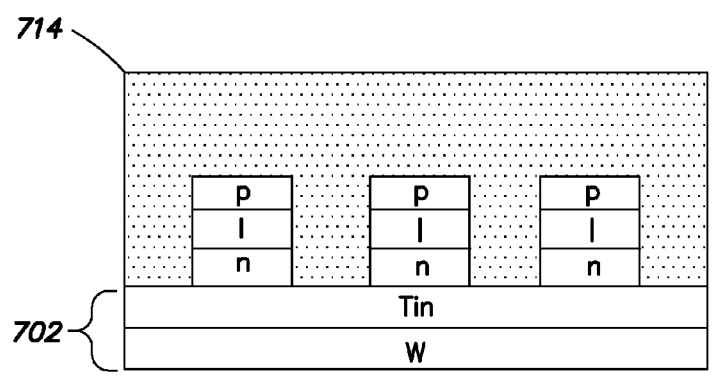

A top portion of the intrinsic region 710 may be positively doped to form a P region 713, also as shown in FIG. 7B. The structure may be coated and gap filed with a first insulating material 714 such as silicon dioxide, silicon nitride, a low k dielectric, etc., as shown in FIG. 7C. For example, between about 400 A and about 1000 A, and more generally between about 200 A and about 2000 A, of insulating material 714 may be deposited.

In some embodiments, if diode 606 is fabricated from deposited silicon (e.g., amorphous or polycrystalline), a silicide layer (not shown) may be formed on diode 606 as seeds to facilitate the crystallization of the diode 606. Therefore, the deposited silicon in a low resistivity state, as fabricated. Such a low resistivity state allows for easier programming of memory cell 600 as a large voltage is not required to switch the deposited silicon to a low resistivity state.

For example, a silicide-forming metal layer (not shown) such as titanium or cobalt may be deposited on P region 713. In some embodiments, an additional nitride layer (not shown) may be formed at a top surface of the silicide-forming metal layer. In particular, for highly reactive metals, such as titanium, an additional cap layer such as TiN layer may be formed on the silicide-forming metal layer. Thus, in such embodiments, a Ti/TiN stack is formed on top of P region 713.

An RTA step may then be performed to form silicide regions by reaction of the silicide-forming metal layer with P region 713. The RTA may be performed at about 540° C. for about 1 minute, and causes the silicide-forming metal layer and the deposited silicon of diode 606 to interact to form a silicide layer, consuming all or a portion of the silicide-forming metal layer.

As discussed above, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., the silicide layer enhances the crystalline structure of silicon diode 606 during annealing). Lower resistivity silicon thereby is provided. Similar results may be achieved for silicon-germanium alloy and/or germanium diodes.

In embodiments in which a nitride layer was formed at a top surface of the silicide-forming metal layer, following the RTA step, the nitride layer may be stripped using a wet chemistry. For example, if the silicide-forming metal layer includes a TiN top layer, a wet chemistry (e.g., ammonium, peroxide, water in a 1:1:1 ratio) may be used to strip any residual TiN.

Figure 7D:
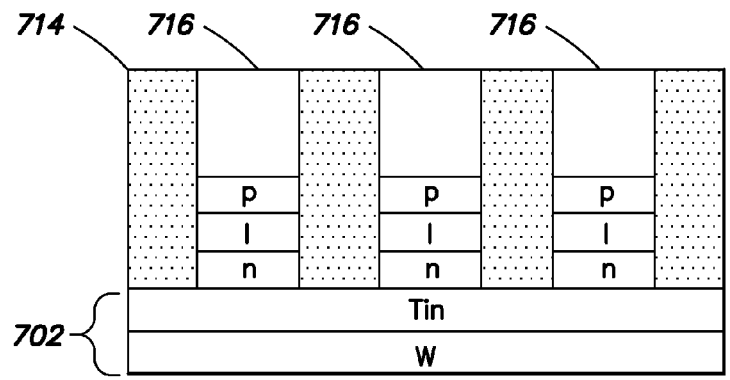
Figure 7E:
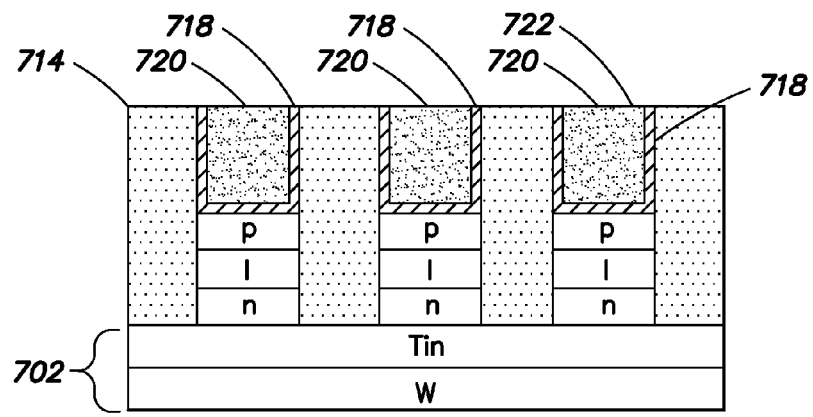
Figure 7E:
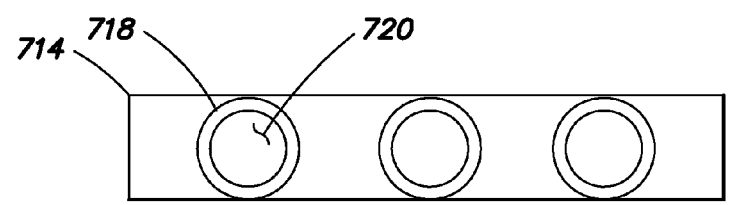

A trench, via or similar feature 716 may be formed in the first insulating material 714 above the diode pillars, as shown in FIG. 7D and carbon material 718 may be deposited in the feature 716 and on the side walls of the feature 716 as shown in FIG. 7E (and top view 7E').

For example, a carbon film 718 may be deposited on the bottom and sidewall regions of the feature 716, as well as on the (top) field regions of the first insulating material 714. Deposition on the sidewalls of the feature 716 allows the desired orientation of the carbon film 718 to be attained. Exemplary feature widths are about 20 nm to about 130 nm and exemplary feature heights are about 0.1 microns to about 2.6 microns, although other sizes may be used.

In some embodiments, to create the via, trench or similar feature 716 in the insulating material 714, a germanium, amorphous carbon or otherwise controllably etchable material is deposited, patterned and etched into a pillar (not shown). Insulating material 714 is subsequently deposited around the germanium pillar and planarized by an etch back process, CMP or the like. The insulating material 714 may be, for example, $SiO_2$, $Si_3N_4$, or any other suitable insulating and/or dielectric material. After planarization, the germanium pillar may be removed with an ashing or other etching technique to generate the feature 716 in the insulating material 714.

After the feature 716 is formed, the carbon film 718 is deposited. The carbon film 718 may be deposited by any suitable technique such as CVD, HDP, PECVD, sputter deposition from an amorphous or graphite target, etc. In some embodiments, post deposition treatment(s) may be employed such as annealing in reduced pressure or oxygen environments to affect or otherwise improve the properties of the carbon film 718. Likewise, passivation of the carbon film 718 with SiN/SiON while maintaining a vacuum may be used to avoid moisture adsorption and interaction between the insulating material 714 and the carbon 718. To improve sidewall coverage, a conformal deposition process may be used in one or more embodiments.

In some exemplary embodiments, a carbon film thickness of about one monolayer to about 1000 A, and more preferably about 400 A to about 600 A, at the sidewalls of the feature 716 may be employed. Other thickness may be used.

In these or other embodiments, the interface between the carbon film 718 and the insulating material 714, such as at the sidewalls of the feature 716, may be modified to improve adhesion between the carbon film 718 and the insulating material 714. For example, carbon material deposition parameters may be adjusted so that a thin region of the carbon film 718, such as a few monolayers, in contact with the insulating material 714 is $sp^3$ rich rather than $sp^2$ rich (as may be preferred for the remainder of the carbon film 718 in some embodiments).

Additionally or alternatively, a thin "capping" layer of ALD, CVD or PECVD silicon dioxide, silicon nitride, etc., may be deposited between the carbon film 718 and the insulating material 714 to improve adhesion. Exemplary capping layer thicknesses are about 50 A to about 800 A, although other thickness ranges may be used.

In some embodiments, following formation of carbon film 718, an anneal step may be performed prior to depositing additional material. In particular, the anneal may be performed in a vacuum or the presence of one or more forming gases, at a temperature in the range from about 450° C. to about 1200° C., for about 60 sec to about 5 hours. The anneal preferably is performed in about an 80% ($N_2$):20% ($H_2$) mixture of forming gases, at about 625° C. for about one hour.

Suitable forming gases may include one or more of $N_2$, Ar, and $H_2$, whereas preferred forming gases may include a mixture having above about 75% $N_2$ or Ar and below about 25% $H_2$. Alternatively, a vacuum may be used. Suitable temperatures may range from about 200° C. to about 1200° C., whereas preferred temperatures may range from about 500° C. to about 650° C. Suitable durations may range from about 60 seconds to about 5 hours, whereas preferred durations may range from about 1 hour to about 1.5 hours. Suitable pressures may range from about 1 mT to about 760 T, whereas preferred pressures may range from about 300 mT to about 600 mT.

A queue time of preferably about 2 hours between the anneal and the deposition of additional layers preferably accompanies the use of the anneal. A ramp up duration may range from about 0.2 hours to about 1.2 hours and preferably is about 0.5 Similarly, in some embodiments, a ramp down duration also may range from about 0.2 hours to about 1.2 hours and preferably is about 0.5 hours.

As discussed above, and while not wanting to be bound by any particular theory, it is believed that carbon-based material may absorb water from the air over time and/or during a wet clean process. Likewise, it is believed that the moisture may increase the likelihood of de-lamination of the carbon-based material, and degradation in switching.

In some cases, it also might be acceptable to have a queue time of 2 hours from the time of deposition of carbon-based material to deposition of additional layers, skipping the anneal altogether. In some cases, in-situ annealing or degas in a vacuum may be used to help to drive out moisture before the next process step. In particular, the in-situ anneal or degas in vacuum is performed in the chamber of the next processing step. Degas in vacuum may also be performed in a transfer chamber or loadlock mounted on the same platform as the process chamber.

For example, if the next processing step is formation of a sidewall liner, the in-situ anneal is performed in the chamber used to form the sidewall liner. The in-situ anneal may be performed at a temperature between about 200° C. and about 350° C., more generally between about 200° C. and about 450° C., for a duration between about 1 minute to about 2 minutes, more generally between about 30 seconds and about 5 minutes, at a pressure of between about 0.1 mT to about 10 T, more generally between about 0.1 mT to about 760 T.

Alternatively, the in-situ anneal may be performed in an environment containing Ar, He, or $N_2$, or a forming gas containing $H_2$ and $N_2$, at a flow rate of between about 1000 sccm to about 8000 sccm, more generally between about 1000 sccm and about 20000 sccm. If degas in vacuum step is used instead of in-situ annealing, the degas is performed at a pressure between about 0.1 mT to about 50 mT, and at a temperature between about room temperature to about 450° C.

Incorporation of such a post-carbon-formation-anneal preferably takes into account other layers of the memory cell, because these other memory cell layers will also be subject to the anneal. For example, the anneal may be omitted or its parameters may be adjusted where the aforementioned preferred anneal parameters would damage the other memory cell layers. The anneal parameters may be adjusted within ranges that result in the removal of moisture without damaging the layers of the annealed memory cell.

For instance, the temperature may be adjusted to stay within an overall thermal budget of a memory cell being formed. Likewise, any suitable forming gases, temperatures and/or durations may be used that are appropriate for a particular memory cell. In general, such an anneal may be used with any carbon-based layer or carbon-containing material, such as layers having CNT material, graphite, graphene, amorphous carbon, etc.

Following formation of the carbon film 718, second dielectric or other insulating material 720 is then deposited onto the carbon film 718 to fill the feature 716 as shown in FIG. 7E (top view 7E'). For example, between about 400 A and about 1200 A, and more generally between about 200 A and about 2200 A of insulating material 720 may be deposited. Subsequent CMP or etch back may be employed to remove the second dielectric material 720 and the carbon film 718 from the field region of the first dielectric material 714, forming a planar surface 722 for the structure, and exposing the upper edges of the carbon film 718 on the sidewalls of the feature 716 as shown in FIGS. 7E and 7E'.

In general, excess deposited carbon material, such as carbon material on the field region of the first insulating material 714, may be removed by etch back, CMP or any suitable process. In this manner, only the sidewalls and/or the bottom of the feature 716 are coated with the carbon film 718. The second dielectric material 720 may be deposited by CVD, HDP, spin-on techniques or the like. The second dielectric material 720 may be $SiO_2$, $Si_3N_4$, any combination thereof, or any other suitable dielectric or insulating material.

In these or other embodiments, the interface between the carbon film 718 and the second insulating material 720 may be modified to improve adhesion between the carbon film 718 and the second insulating material 720. For example, carbon material deposition parameters may be adjusted so that a thin region of the carbon film 718, such as a few monolayers, in contact with the insulating material 720 is $sp^3$ rich rather than $sp^2$ rich (as may be preferred for the remainder of the carbon film 718 in some embodiments).

Additionally or alternatively, a thin "capping" layer of ALD, CVD or PECVD silicon dioxide, silicon nitride, etc., may be deposited between the carbon film 718 and the second insulating material 720 to improve adhesion. Exemplary capping layer thicknesses are about 50 A to about 800 A, although other thickness ranges may be used.

Following planarization of the structure, a hardmask (not shown) such as amorphous Si or TiN, may be deposited and patterned on the structure to be used to etch a first set of parallel trenches down though the top portion of the pillars to the top of the diode layer 708. A highly directional anisotropic etch (similar to a spacer etch) may be used to etch off the bottom layer of the carbon film 718. A third insulating material 724 is then used to gap fill the etched trench and the top surface may be planarized again.

At this point, with the top carbon material portion of the original pillars each etched into two distinct memory cells, a top conductive layer may be deposited and double patterned into top conductor lines approximately perpendicular to the bottom conductor lines 702 to form a double density memory array.

Alternatively, in some embodiments, a second hardmask (not shown), such as amorphous Si or TiN and rotated ninety degrees from the first hardmask, may be deposited and patterned on the structure (before the top conductor lines are formed) to be used to etch a second set of parallel trenches down though the top portion of the pillars to the top of the diode layer 708.

Figure 7F:
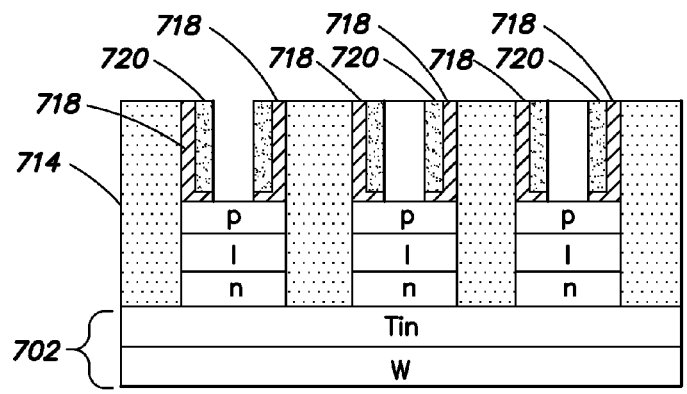
Figure 7F:
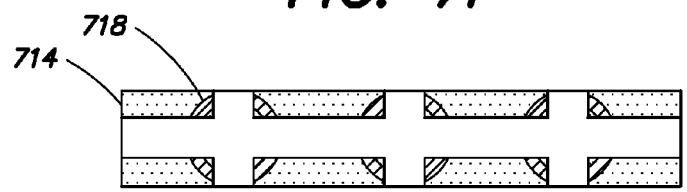

Note that the second set of parallel trenches are etched approximately perpendicular to the first set of parallel trenches. In such embodiments, the top carbon material portion of the original pillars are each etched into four distinct memory cells that share a common diode layer 708. FIG. 7F (and top view 7F') depicts the pillars partial etched in two perpendicular directions. Note that in some parts of this description, etching down to the top of the diode layer 708 is referred to as a partial etch of the pillar.

Figure 7G:
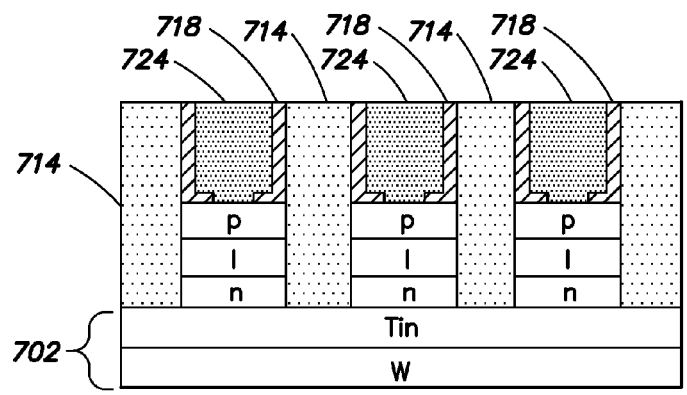
Figure 7G:
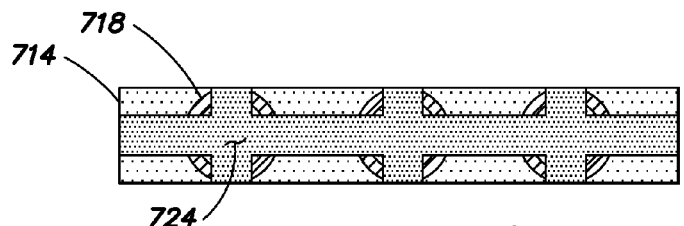

In some embodiments, a single hardmask and a single etching step may be used to concurrently partial etch each of the pillars into four memory cells with a shared diode layer 708 as depicted in FIG. 7F'. The third insulating material 724 is then used to gap fill the etched trench(es) and the top surface may be planarized again as shown in FIG. 7G (and in top view FIG. 7G').

Figure 7H:
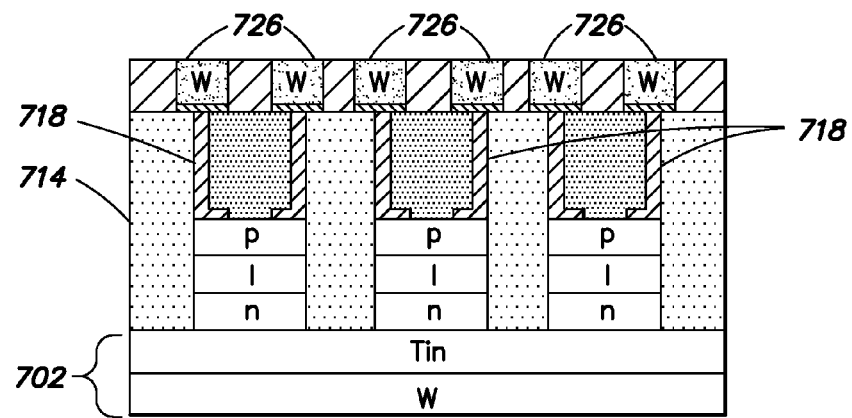

As shown in FIG. 7H, at this point, with the original pillars each partial etched into two or four distinct memory cells, a top conductive layer (e.g., a tungsten, copper, aluminum, or similar conductive layer and/or a TiN or similar appropriate barrier/adhesion layer) may be deposited (e.g., using a damascene process), double patterned into top conductor lines 726 approximately perpendicular to the bottom conductor lines 702 to form a double or quadruple density memory array.

Note that in the depicted quadruple density embodiment, the bottom conductor lines 702 may also be double patterned to provide an appropriate number of conductors for the additional memory cells created by the present invention. In at least one embodiment, the first and second conductors 702, 726 may be rail conductors that extend in different directions (e.g., substantially perpendicular).

Figure 7I:
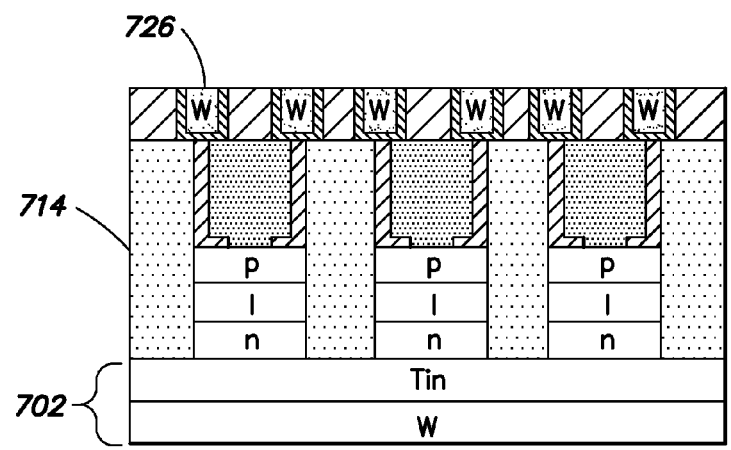

FIG. 7I depicts an alternative conductor 726 structure that may be employed with the present invention. The conductor 726 structure depicted in FIG. 7H is suitable for relatively large geometry conductor lines. In this embodiment, TiN/W layers are blanket deposited, patterned using a metal etch process, and then gap-filled with dielectric.

In contrast, the conductor 726 structure depicted in FIG. 7I is suitable for relatively small geometry conductor lines which may be particularly useful with the increased density memory cells of the present invention. In this embodiment, a dielectric film is initially blanket deposited, the film is patterned using a dielectric etch process, a conformal TiN liner is deposited, and then a W layer is deposited. In some embodiments, either or both of the bottom and top conductors 702, 726 may be formed using either of the two conductor structures depicted in FIGS. 7H and 7I.

Following formation of top conductors 726, the resultant structure may be annealed to crystallize the deposited semiconductor material of diode 606 (and/or to form silicide regions by reaction of the silicide-forming metal layer with P region 713). The lattice spacing of titanium silicide and cobalt silicide are close to that of silicon, and it appears that the silicide layers may serve as "crystallization templates" or "seeds" for adjacent deposited silicon as the deposited silicon crystallizes (e.g., the silicide layer may enhance the crystalline structure of silicon diode 106 during annealing at temps of about 600-800° C.). Lower resistivity diode material thereby is provided. Similar results may be achieved for silicon-germanium alloy and/or germanium diodes.

Thus in at least one embodiment, a crystallization anneal may be performed for about 10 seconds to about 2 minutes in nitrogen at a temperature of about 600 to 800° C., and more preferably between about 650 and 750° C. Other annealing times, temperatures and/or environments may be used.

Using embodiments of the present invention, an MGCM structure with shared diode layers and double or quadruple density may be formed. Within the MGCM structure, conduction between the conductors 702, 726 may occur along vertically oriented carbon material which coats the sidewalls of the feature 716. As such, conduction may occur along the length of the carbon pi bonds of the carbon film 718, and resistivity switching may be observed. Further, such a structure reduces the likelihood of an inadvertent vertical short between the top and bottom conductors 702, 726.

In accordance with one or more embodiments of the invention, vertically oriented carbon material may be employed within the memory cells of a memory array. For example, the MGCM structure described above, or a similar carbon-based resistivity switching element, may be placed in series with a steering element to form a memory cell and the memory cell may be etched or partial etched into two or four or more memory cells.

The present invention provides numerous benefits. For example, the smaller dimensions of the memory cells formed according to the methods of the present invention enables denser packing of memory arrays. The smaller memory cells have reduced operating voltage and current requirements (i.e., reduced power requirements) for read and write functions. Voltage, current, and total power requirements all scale with the memory cell size.

Likewise, memory arrays formed with the smaller unit memory cells of the present invention can be programmed with less power. In some embodiments, the smaller memory cells of the present invention, operating with less power than conventional sized memory cells, may be programmed faster than conventional sized memory cells. In addition, due to the lower power consumption, less heat must be dissipated in memory arrays formed using the unit cells of the present invention.

The foregoing description discloses only exemplary embodiments of the invention. Modifications of the above disclosed apparatus and methods which fall within the scope of the invention will be readily apparent to those of ordinary skill in the art. Accordingly, while the present invention has been disclosed in connection with exemplary embodiments thereof, it should be understood that other embodiments may fall within the spirit and scope of the invention, as defined by the following claims.

The invention claimed is:

1. A memory cell comprising:
   a shared diode layer; and
   a memory element coupled to the diode layer,
   wherein the memory element has a pie slice-shape, and includes a sidewall having a carbon film thereon.

2. The memory cell of claim 1, wherein the memory element has an approximately half of a pie shape.

3. The memory cell of claim 1, wherein the memory element has an approximately quarter of a pie shape.

4. The memory cell of claim 1, wherein the memory element has an approximately eighth of a pie shape.

5. The memory cell of claim 1, wherein the memory element has an approximately sixteenth of a pie shape.

6. The memory cell of claim 1, wherein the memory element comprises a reversible resistance-switching element.

7. The memory cell of claim 1, wherein the memory element comprises a carbon-based material.

8. The memory cell of claim 1, wherein the memory element comprises one of amorphous carbon, graphene, graphite, or carbon nanotubes.

9. A plurality of memory cells comprising:
   a shared diode layer shaped into a circular disk; and
   a plurality of radially disposed memory elements each coupled to the shared diode layer along a circumference of the shared diode layer,
   wherein memory elements each have a pie slice-shape, and includes a sidewall having a carbon film thereon.

10. The memory cells of claim 9, wherein the memory elements, each coupled to the shared diode layer, are shaped in two approximately half pie shapes.

11. The memory cells of claim 9, wherein the memory elements, each coupled to the shared diode layer, are shaped in four approximately quarter pie shapes.

12. The memory cells of claim 9, wherein the memory elements, each coupled to the shared diode layer piece, are shaped in eight approximately eighth of a pie shapes.

13. The memory cells of claim 9, wherein the memory elements, each coupled to the shared diode layer piece, are shaped in sixteen approximately sixteenth of a pie shapes.

14. The memory cells of claim 9, wherein the memory elements each comprise reversible resistance-switching material.

15. The memory cells of claim 9, wherein the memory elements each comprise a carbon-based material.

16. The memory cells of claim 9, wherein the memory elements each comprise one of amorphous carbon, graphene, graphite, or carbon nanotubes.

17. A memory cell formed by:
   forming a first pillar above a substrate, the pillar including a steering element and a first memory element;
   performing a first etch through the first memory element to form two second memory elements, wherein each second memory element is coupled to the steering element; and
   performing a second etch through the two second memory elements to form four third memory elements, wherein each third memory element is coupled to the steering element.

18. The memory cell of claim 17, wherein the steering element comprises a p-i-n diode.

19. The memory cell of claim 17, wherein the first, second and third memory elements each comprise a reversible resistance-switching element.

20. The memory cell of claim 17, wherein the first, second and third memory elements each comprise a carbon-based material.

* * * * *